(12) United States Patent
Maitani et al.

(10) Patent No.: US 8,778,790 B2
(45) Date of Patent: Jul. 15, 2014

(54) MANUFACTURING METHOD OF SEMICONDUCTOR DEVICE AND SEMICONDUCTOR DEVICE

(75) Inventors: Tota Maitani, Kanagawa (JP); Yutaro Ebata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 217 days.

(21) Appl. No.: 13/359,867

(22) Filed: Jan. 27, 2012

(65) Prior Publication Data
US 2012/0193787 A1    Aug. 2, 2012

(30) Foreign Application Priority Data
Jan. 31, 2011    (JP) .................................. 2011-017672

(51) Int. Cl.
*H01L 21/44* (2006.01)

(52) U.S. Cl.
USPC ........... 438/612; 438/618; 438/666; 438/687; 438/652; 257/E23.02

(58) Field of Classification Search
USPC .......................... 438/612, 618, 652, 666, 687; 257/E23.02
See application file for complete search history.

(56) References Cited

U.S. PATENT DOCUMENTS

| | | | | |
|---|---|---|---|---|
| 6,218,281 | B1 * | 4/2001 | Watanabe et al. | 438/612 |
| 6,350,633 | B1 * | 2/2002 | Lin | 438/113 |
| 6,660,626 | B1 * | 12/2003 | Lin | 438/618 |
| 7,220,657 | B2 * | 5/2007 | Ihara et al. | 438/466 |
| 2005/0255686 | A1 * | 11/2005 | Yamano et al. | 438/618 |
| 2007/0184643 | A1 * | 8/2007 | Rinne | 438/612 |
| 2009/0068831 | A1 * | 3/2009 | Enquist et al. | 438/618 |
| 2012/0270396 | A1 * | 10/2012 | Hosomi | 438/687 |

FOREIGN PATENT DOCUMENTS

JP    2005-038932 A    2/2005

* cited by examiner

*Primary Examiner* — Nitin Parekh
(74) *Attorney, Agent, or Firm* — Mattingly & Malur, PC

(57) ABSTRACT

A rewiring is formed by forming a Cu seed layer of copper over an opening and insulating films, forming a photoresist film over the Cu seed layer, a step of forming copper film by plating-growth over the Cu seed layer, and forming a Ni film. After forming an Au film in an opening (pad region) over the rewiring, the photoresist film is removed and passivation processing is performed on the Ni film. Then, the Cu seed layer other than the formation region of the rewiring is etched. According to these steps, a passivation film is formed on the surface of the Ni film and the reduction in film thickness of the Ni film by the etching can be reduced. Furthermore, it is possible to reduce trouble due to distortion of a substrate resulting from an increase in thickness of the Ni film in view of reduction in film thickness.

25 Claims, 27 Drawing Sheets

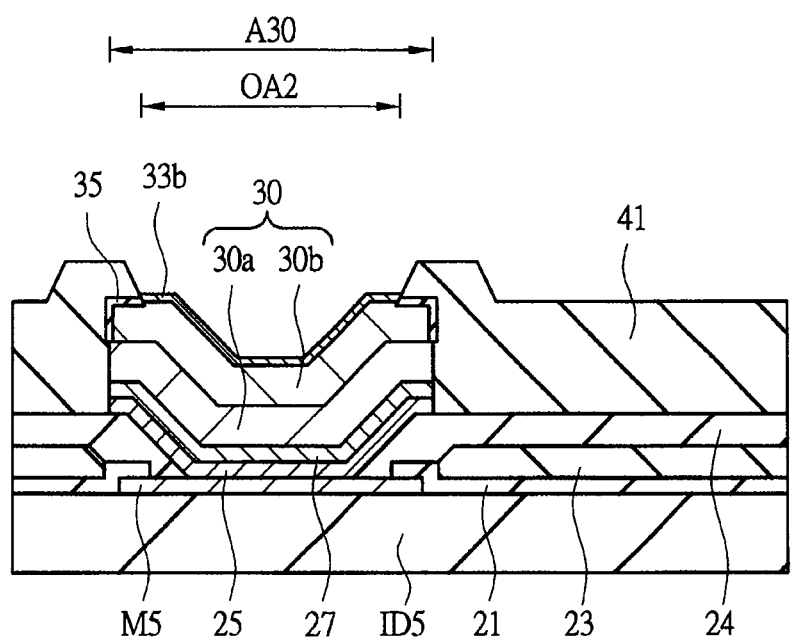

MANUFACTURING METHOD OF SEMICONDUCTOR DEVICE AND SEMICONDUCTOR DEVICE

CROSS-REFERENCE TO RELATED APPLICATION

The disclosure of Japanese Patent Application No. 2011-17672 filed on Jan. 31, 2011 including the specification, drawings and abstract is incorporated herein by reference in its entirety.

BACKGROUND

The present invention relates to a manufacturing method of a semiconductor device and a semiconductor device and, in particular, to a manufacturing method of a semiconductor device having a Cu—Ni wiring and to technology effective when applied to a configuration of a semiconductor device having a Cu—Ni wiring.

A semiconductor device has semiconductor elements, such as MISFETs, formed over a semiconductor substrate and wirings in multiple layers formed above the semiconductor elements. Then, over the uppermost layer wiring, for example, a rewiring including a Cu—Ni wiring is formed. One end of the rewiring serves as a coupling part coupled with the uppermost wiring and the other end of the rewiring serves as a pad region. In this manner, the rewiring plays a role in coupling the end part of the uppermost layer wiring and a pad region in a predetermined position of a semiconductor chip.

For example, in Patent Document 1 (Japanese Patent Laid-Open No. 2005-38932) described below, a semiconductor device having a rewiring layer is disclosed and manufacturing technology of a semiconductor device having steps as shown in (1) to (5) below when forming the rewiring layer is disclosed (in particular, see paragraphs [0072] to [0077] in Patent Document 1).

(1) By applying a first photosensitive resin over a base metal layer [6b] and exposing and developing it, a first photosensitive resist [11a] is formed in the part excluding the formation part of a main conductor layer [6a] [FIG. 2(d)]. After forming the first photosensitive resist [11a], it is temporarily cured [FIG. 2(e)].

(2) By utilizing the first photosensitive resist [11a], the main conductor layer [6a] is formed. Specifically, by performing electrolytic plating using, for example, a copper plating liquid including copper sulfate, the main conductor layer [6a] including Cu is formed in an opening of the first photosensitive resist [11a] [FIG. 2(f)]. After that, the first photosensitive resist [11a] is removed [FIG. 2(g)].

(3) By applying a second photosensitive resist over the main conductor layer [6a] and exposing and developing it, a second photosensitive resist [11b] is formed so that only the upper surface or the surface of the main conductor layer [6a] excluding a part of the main conductor layer [6a] is exposed, which is exposed because a metal pillar [9] is formed. After that, it is temporarily cured [FIG. 2(h)].

(4) Then, by utilizing the second photosensitive resist [11b], a metal layer [7] is formed. Specifically, a Ni layer having a film thickness of 1 μm to 3 μm is formed in the opening of the second photosensitive resist [11b] by, for example, the electrolytic plating method. After that, the second photosensitive resist [11b] is removed by a stripping solution.

(5) Next, the following processing is performed by using, for example, an etchant including ammonium persulfate as a principal component and an etchant including a hydrogen peroxide solution and inorganic ammonia as principal components and desirably, including an additive having a function to protect the main conductor layer [6a] against the etchant by temporarily forming a surface protection layer on the main conductor layer [6a]. The base metal layer [6b] in the part other than the rewiring layer, that is, in the part where the metal layer [7] is not formed and the barrier metal layer [5] located under the part are removed by etching [FIG. 3(j)]. Those inside [ ] are symbols or figure numbers described in Patent Document 1.

SUMMARY

The inventors of the present invention are engaged in research and development of the semiconductor device having a rewiring as described above. As the rewiring, a Cu—Ni rewiring using a copper film (Cu) as its lower layer and a nickel film (Ni) as its upper layer is adopted and these metal films are formed by the plating method.

However, as will be explained in detail later, there has occurred such a problem that when etching a Cu seed layer formed when forming the metal film by the plating method, the Ni film of the Cu—Ni rewiring is etched and the thickness of the Ni film is reduced.

Furthermore, when the Ni film is formed thick in advance in view of the reduction in film thickness of the Ni film, distortion occurs in a substrate (semiconductor device) by the stress of the Ni film, that may cause trouble in the manufacturing step and the apprehensive influence on the element characteristics.

Therefore, an object of the present invention is to provide a manufacturing method of a semiconductor device excellent in characteristics, furthermore to improve throughput of a manufacturing step of a semiconductor device, and to provide a manufacturing method of a semiconductor device capable of reducing the manufacturing cost.

In addition, another object of the present invention is to provide a semiconductor device excellent in characteristics and furthermore to provide a semiconductor device capable of reducing the manufacturing cost.

The object, other objects, and new features of the present invention will become clear from the description of the present specification and the accompanying drawings.

The following explains briefly the outline of a typical invention among the inventions disclosed in the present application.

A manufacturing method of a semiconductor device shown in a typical embodiment among the inventions disclosed in the present application has the following steps (a) to (f). (a) is a step of forming a first wiring including a conductive film above a substrate. (b) is a step of forming a first insulating film that exposes a first region of the first wiring over the first wiring. (c) is a step of forming a second wiring extending from the first region of the first wiring over the first insulating film. The step (c) has a step (c1) of forming a first copper film including copper as a principal component over the first region and the first insulating film and a step (c2) of forming a first mask film that opens a formation region of the second wiring over the first copper film. Furthermore, the step (c) has a step (c3) of forming a second copper film including copper as a principal component by plating-growth over the first copper film in the formation region of the second wiring and a step (c4) of forming a first nickel film including nickel as a principal component over the second copper film and is a step of forming the second wiring including the first copper film, the second copper film, and the nickel film by theses steps. (d) is a step of forming a gold film including gold as a principal component in a pad region over the second wiring. (e) is a step of, after the step (d), forming a passivation film of nickel on the surface of the first nickel film by removing the first mask film and performing passivation processing on the first nickel film. (f) is a step of, after the step (e), etching the first copper film.

A manufacturing method of a semiconductor device shown in a typical embodiment among the inventions disclosed in the present application has the following steps (a) to (g). (a) is a step of forming a first conductive film above a substrate. (b) is a step of forming a first insulating film that exposes a first region of the first conductive film over the first conductive film. (c) is a step of forming a second conductive film located over the first region of the first conductive film and the first insulating film. The step (c) has a step (c1) of forming a first copper film including copper as a principal component over the first region and the first insulating film and a step (c2) of forming a first mask film that opens a formation region of the second conductive film over the first copper film. Furthermore, the step (c) has a step (c3) of forming a second copper film including copper as a principal component by plating-growth over the first copper film in the formation region of the second conductive film and a step (c4) of forming a nickel film including nickel as a principal component over the second copper film and is a step of forming the second conductive film including the first copper film, the second copper film, and the nickel film by theses steps. (d) is a step of, after the step (c), forming a passivation film of nickel on the surface of the nickel film by removing the first mask film and performing passivation processing on the nickel film. (e) is a step of, after the step (d), etching the first copper film. (f) is a step of removing the passivation film over a pad region of the second conductive film. (g) is a step of, after the step (f), forming a gold film including gold as a principal component in the pad region.

A semiconductor device shown in a typical embodiment among the inventions disclosed in the present application has the following configurations (a) to (e). (a) is a first wiring including a conductive film arranged above a substrate. (b) is a first insulating film arranged over the first wiring and having an opening that exposes a first region of the first wiring. (c) is a second wiring extending from a first region of the conductive film over the first insulating film and has (c1) a copper film including copper as a principal component and (c2) a first nickel film arranged over the copper film and including nickel as a principal component. (d) is a gold film including gold as a principal component arranged over the first nickel film over the pad region of the second wiring. (e) is a passivation film of nickel arranged over the first nickel film of the second wiring. Then, on the surface of the first nickel film, the passivation film and the gold film are formed.

A semiconductor device shown in a typical embodiment among the inventions disclosed in the present application has the following configurations (a) to (f). (a) is a first conductive film arranged above a substrate. (b) is a first insulating film arranged over the first conductive film and having an opening that exposes a first region of the first conductive film. (c) is a second conductive film arranged over the first region of the first conductive film and the first insulating film and has (c1) a copper film including copper as a principal component and (c2) a nickel film arranged over the copper film and a nickel film including nickel as a principal component. (d) is a second insulating film that opens a pad region of the second conductive film. (e) is a bump electrode arranged above the nickel film over the pad region of the second conductive film. (f) is a passivation film of nickel arranged in a region sandwiched by the nickel film and the second insulating film.

According to a semiconductor device shown in a typical embodiment shown below among the inventions disclosed in the present application, it is possible to improve the characteristics of a semiconductor device. Furthermore, it is possible to reduce the manufacturing cost of a semiconductor device.

According to a manufacturing method of a semiconductor device shown in a typical embodiment shown below among the inventions disclosed in the present application, it is possible to manufacture a semiconductor device excellent in characteristics. Furthermore, it is possible to improve throughput in the manufacturing step of a semiconductor device. Moreover, it is possible to reduce the manufacturing cost in the manufacturing step of a semiconductor device.

BRIEF DESCRIPTION OF THE DRAWINGS

FIG. 30 is a cross-sectional view of essential parts showing the manufacturing step of the semiconductor device in the third embodiment, showing the step following that in FIG. 29.

DETAILED DESCRIPTION

Figure 1:
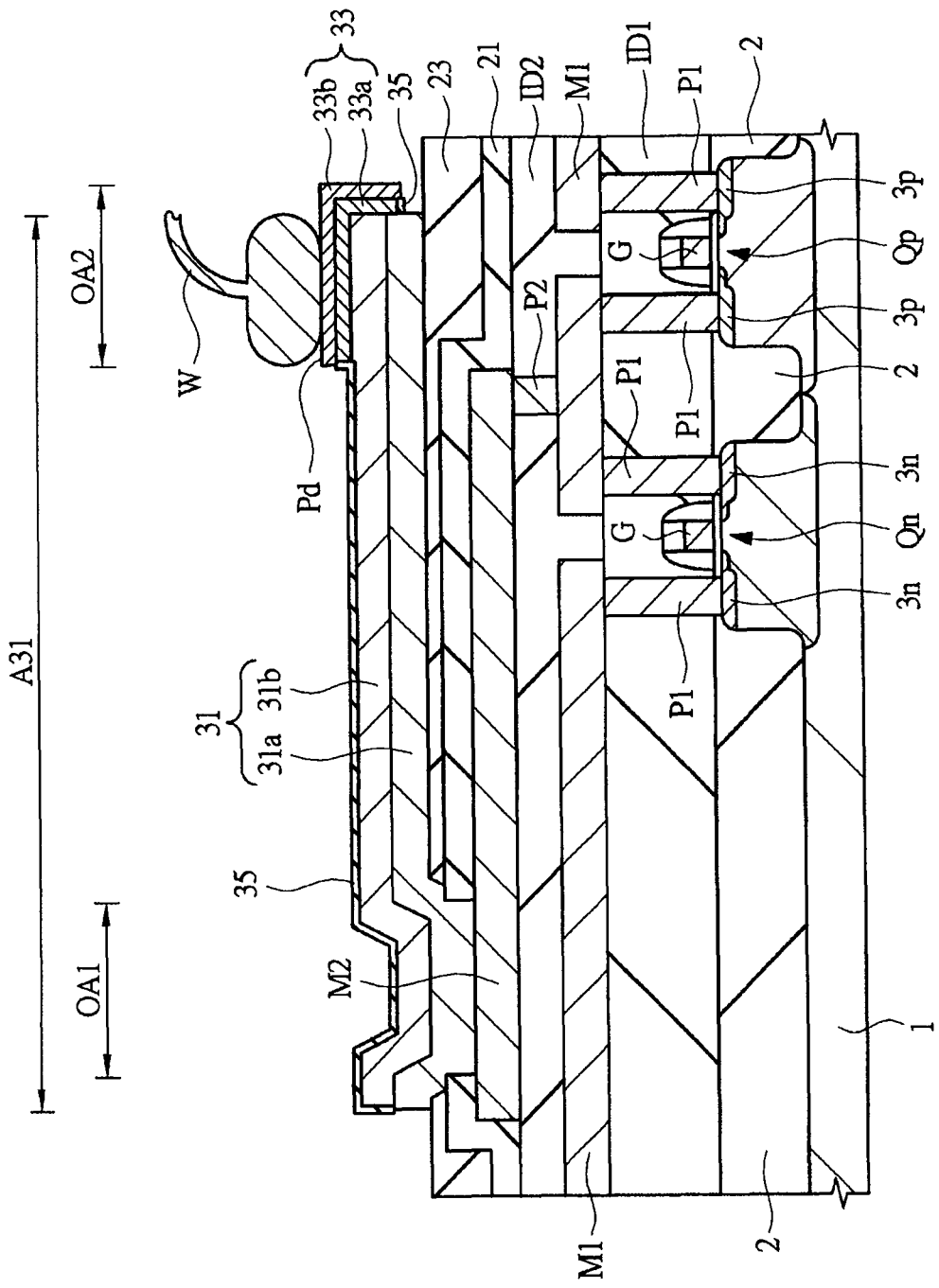
FIG. 1 is a cross-sectional view of essential parts showing a configuration of a semiconductor device in a first embodiment.

The following embodiments will be explained, divided into a plurality of sections or embodiments, if necessary for convenience. Except for the case where it shows clearly in particular, they are not mutually unrelated and one has relationships such as a modification, application example, detailed explanation, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the number etc. (including the number, a numeric value, an amount, a range, etc.)

Hereinafter, embodiments of the present invention are explained in detail with reference to the drawings. In all the drawings for explaining embodiments, the same or related symbol is attached to the member having the same function and the repeated explanation thereof is omitted. Furthermore, in the following embodiments, the explanation of the same or similar part is not repeated, as a principal rule, except for the case where it is necessary in particular.

In a drawing used in the embodiments, in order to make the drawing easy-to-see, hatching may be omitted even if it is a cross-sectional view. Furthermore, in order to make the drawing easy-to-see, hatching may be attached even if it is a plan view.

First Embodiment

Hereinafter, a configuration and a manufacturing method of a semiconductor device in a first embodiment are explained in detail with reference to the drawings. FIG. 1 is a cross-sectional view of essential parts showing the configuration of the semiconductor device in the present embodiment. FIG. 2 to FIG. 12 are cross-sectional views or plan views of essential parts showing the manufacturing step of the semiconductor device in the present invention.

[Explanation of Structure]

First, the characteristic configuration of the semiconductor device in the present embodiment will be explained with reference to FIG. 1.

As shown in FIG. 1, the semiconductor device in the present embodiment has, for example, a p-channel type MISFET Qp and an n-channel type MISFET Qn as a semiconductor element formed over a semiconductor substrate (substrate) 1. Besides the MISFETs described above, other various elements, such as capacitor elements, resistor elements, and memory cells, may be included.

Over these MISFETs (Metal Insulator Semiconductor Field Effect Transistor), an interlayer insulating film ID1 is arranged. Furthermore, over source/drain regions (3n, 3p) of the MISFET, a first layer wiring M1 is arranged via a plug P1. Moreover, over the first layer wiring M1, a second layer wiring M2 is formed. The first layer wiring M1 and the second layer wiring M2 are electrically coupled by a plug P2 and regions other than the plug P2 are electrically insulated by an interlayer insulating film ID2.

The first layer wiring M1 and the second layer wiring M2 are wirings including aluminum (conductive film including Al as a principal component). The principal component is a component mixed in a composition ratio of at least 50% or more.

Over the second layer wiring (uppermost layer wiring) M2, protection insulating films (21, 23, insulating film) are formed, and from an opening of the protection insulating film (here, opening of the first protection insulating film 21) OA1, the second layer wiring (Al film) M2 is exposed.

From the exposed part (the opening OA1, first pad region), a rewiring 31 is arranged over the protection insulating films (21, 23). The rewiring 31 plays a role in routing the exposed part (the opening OA1, first pad region) to a desired region over the semiconductor substrate (semiconductor chip). As described above, by using the rewiring 31 and using the end part of the rewiring 31 as a pad region Pd (opening OA2, second pad region), it is possible to easily make an attempt to electrically couple an external coupling terminal, such as a wiring substrate, and the semiconductor substrate (semiconductor chip).

The rewiring 31 includes a stacked film (Cu—Ni wiring) of a copper film (conductive film including Cu as a principal component) 31a and a nickel film (conductive film including Ni as a principal component) 31b. The Cu film 31a is a film grown by plating from a thin copper film, which is a seed layer in the lower layer, and in the lower layer of the Cu film 31a, a seed layer (not shown schematically in FIG. 1. See FIG. 12) is arranged. At the lower part of the seed layer, a barrier layer (not shown schematically in FIG. 1. See FIG. 12) is arranged. The Ni film 31b is a film grown by plating over the Cu film 31a. Hereinafter, a seed layer (seed film) 27 is sometimes referred to as the Cu seed layer 27. The Cu seed layer and the barrier film also have conductivity, and thus they can be considered to be included in the rewiring 31.

Over the end part of the rewiring 31, a pad pattern 33 is arranged. The pad pattern 33 is a base layer (base layer of a pad region) aimed at the coupling with a wiring W and the surface of the pad pattern 33 forms the pad region (coupling part with the wiring, coupling part with the external coupling terminal) Pd. The pad pattern 33 includes a stacked film of a nickel film (conductive film including Ni as a principal component) 33a and a gold film (conductive film including Au as a principal component) 33b.

Figure 8:
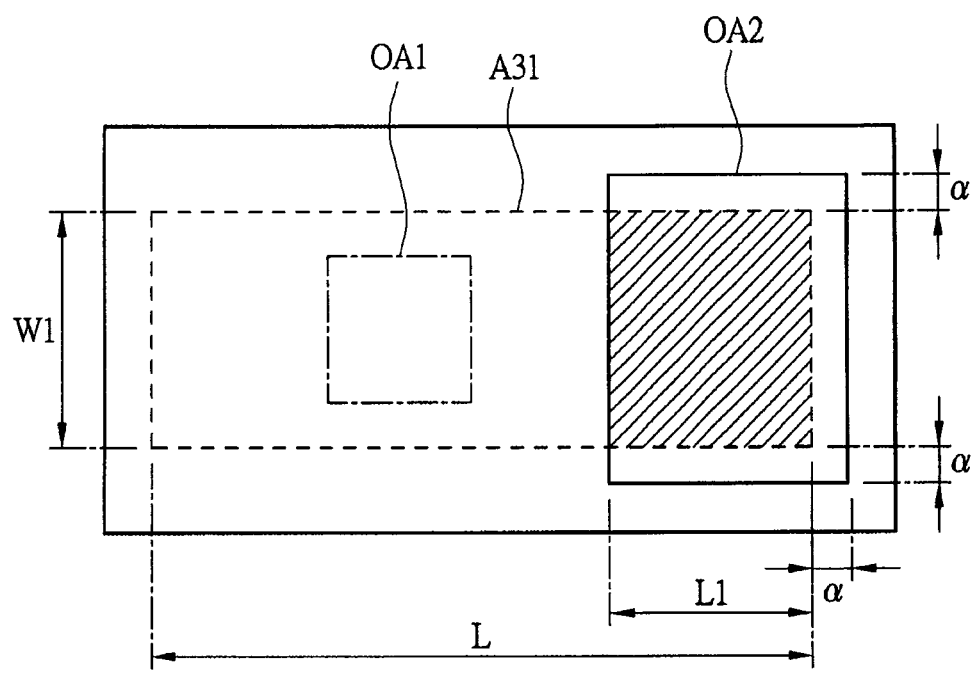
FIG. 8 is a plan view of essential parts showing the manufacturing step of the semiconductor device in the first embodiment.

The formation region of the pad pattern 33 is larger than the end part region of the rewiring 31 and is a region including the outer circumference of the end part region of the rewiring 31 (see FIG. 8). Consequently, the pad pattern 33 is arranged so as to cover not only the upper surface of the end part region of the rewiring 31 but also its side surface (see FIG. 1). Due to such a configuration, the contact area between the rewiring 31 and the pad pattern 33 increases and peeling of the pad pattern 33 can be reduced.

As the characteristic configuration of the semiconductor device in the present embodiment, on the surface of the Ni film 31b configuring the rewiring 31, in a region other than the formation region of the pad pattern 33 (the pad region Pd, the opening OA2), a Ni passivation film 35 is arranged. Furthermore, on the surface of the Ni film 33a configuring the pad pattern 33, in a region not covered with the Au film 33b, that is, on the side surface (exposed region, exposed surface) of the Ni film 33a also, the Ni passivation film 35 is arranged.

The Ni passivation film 35 is a Ni oxide film (NixOy) and a film formed by passivation processing. The passivation processing is performed by, for example, processing for bringing a nickel film into contact with an oxidizing solution. The oxidizing solution is, for example, a solution (processing liquid) containing a hydrogen peroxide solution and more specifically, a solution containing ammonia and a hydrogen peroxide solution (ammonia/hydrogen peroxide mixture) is used appropriately as a passivation processing liquid of nickel. Furthermore, by performing plasma processing on a nickel film in an oxidizing atmosphere, it is possible to passivate a nickel film.

The Ni passivation film described above is an oxide film, but unlike in the case of a native Ni oxide film, it is a fine, stable film. The native Ni oxide film is more susceptible to etching than the Ni passivation film and for example, when etching is performed by using the ammonia/hydrogen peroxide mixture described above as an etchant, the etching rate of the native Ni oxide film is one hundred times or more the etching rate of the Ni passivation film. That is, the etching rate of the Ni passivation film is one-hundredth or less of the etching rate of the native Ni oxide film. Furthermore, unlike in the case of the native Ni oxide film, the Ni passivation film described above is a fine, stable film, and thus it is difficult to dissolve it even by using a strong acid, such as a sulfuric acid and hydrochloric acid.

By arranging the Ni passivation film 35 as described above, the corrosion resistance of the Ni film 31b is improved. Furthermore, as will be explained in detail in a manufacturing step, to be described later, it is possible to reduce the reduction in film thickness of the Ni film 31b when etching the Cu seed layer 27. Consequently, it is possible to form the Ni film 31b thin in advance and reduce stress applied to the wiring, element (MISFET), etc., in the lower layer.

Furthermore, over the pad pattern 33 (the pad region Pd), the wire (conductive material) W aimed at electrical coupling with an external coupling terminal of the wiring substrate, to be described later, is arranged.

[Explanation of Manufacturing Method]

Next, with reference to FIG. 1 to FIG. 12, a manufacturing step of the semiconductor device in the present embodiment will be explained and at the same time, the configuration of the semiconductor device is made clearer.

First, the semiconductor substrate 1 on which a plurality of the wirings (M1, M2) is formed above the semiconductor elements (the n-channel type MISFET Qn and the p-channel type MISFET Qp) as shown in FIG. 1 is prepared.

[Step of Forming Qn, Qp]

There are no limitations on the forming method of the semiconductor elements (the n-channel type MISFET Qn and the p-channel type MISFET Qp) and, for example, these can be formed by steps shown below (see FIG. 1).

For example, a groove is formed by etching the semiconductor substrate 1 including p-type single crystal silicon and an element isolation region 2 is formed by embedding, for example, a silicon oxide film, as an insulating film inside the groove. By the element isolation region 2, an active region in which the n-channel type MISFET Qn is formed and an active region in which the p-channel type MISFET Qp is formed are defined.

Next, after injecting p-type impurities into the active region of the semiconductor substrate 1, in which the n-channel type MISFET Qn is formed, by diffusing the impurities by thermal processing, a p-type well is formed. Furthermore, after injecting n-type impurities into the active region of the semiconductor substrate 1, in which the p-channel type MISFET Qp is formed, by diffusing the impurities by thermal processing, an n-type well is formed. Subsequently, for example, by thermally oxidizing the surface of the semiconductor substrate 1 (the p-type well and the n-type well), a gate insulating film is formed.

Next, over the gate insulating film, for example, a polycrystal silicon film doped with impurities is deposited as a conductive film, and further, for example, a silicon nitride film is deposited as an insulating film on the top thereof. Next, after etching the silicon nitride film, by etching the polycrystal silicon film using the silicon nitride film as a mask, a gate electrode G is formed. The step of selectively removing the film in the lower layer using a film in a desired shape (mask film, photoresist film) as a mask as described above is referred to as "patterning".

Next, by injecting n-type impurity ions into the p-type well on both sides of the gate electrode G, an n⁻-type semiconductor region is formed and by injecting p-type impurity ions into the n-type well on both sides of the gate electrode G, a p⁻-type semiconductor region is formed.

Next, over the entire surface of the semiconductor substrate 1, after depositing, for example, a silicon nitride film as an insulating film, by performing anisotropic etching, a sidewall spacer is formed on a sidewall of the gate electrode G.

Next, by injecting n-type impurity ions into the p-type well using the gate electrode G and the sidewall spacer as a mask, an n⁺-type semiconductor region higher in the impurity concentration than the n⁻-type semiconductor region is formed and by injecting p-type impurity ions into the n-type well using the gate electrode G and the sidewall spacer as a mask, a p⁺-type semiconductor region higher in the impurity concentration than the p⁻-type semiconductor region is formed.

By the above steps, the n-channel type MISFET Qn comprising the source/drain region 3n with an LDD (Lightly Doped Drain) structure including the n⁻-type semiconductor region and the n⁺-type semiconductor region and the p-channel type MISFET Qp comprising the source/drain region 3p with the LDD structure including the p⁻-type semiconductor region and the p⁺-type semiconductor region are formed (see FIG. 1).

[Step of Forming M1, M2]

There are no limitations on the forming method of the wirings (M1, M2) and these can be formed by, for example, steps shown below (see FIG. 1).

First, over the n-channel type MISFET Qn and the p-channel type MISFET Qp shown in FIG. 1, for example, a silicon oxide film is deposited as an insulating film by the CVD (Chemical Vapor Deposition) method etc. After that, as necessary, by polishing the surface of the silicon oxide film to flatten the surface by the chemical mechanical polishing (CMP) method etc., the interlayer insulating film ID1 is formed.

Next, by patterning the interlayer insulating film ID1, over the source/drain regions 3n, 3p respectively, a contact hole (coupling hole) is formed. Next, over the interlayer insulating film ID1 including the inside of the contact hole, for example, a tungsten (W) film is formed as a conductive film by the CVD method etc. and by polishing the W film by the CMP method etc. until the interlayer insulating film ID1 is exposed, the conductive film is embedded within the contact hole. By this step, the plug (coupling part, contact plug) P1 is formed. It may also be possible to provide a barrier film including a single layer film of, for example, a titanium nitride (TiN) film or titanium (Ti) film, or a stacked film of these in the lower layer of the W film.

Then, over the interlayer insulating film ID1 including the top of the plug P1, for example, a TiN film is formed as a barrier film (not shown schematically) by the sputtering method etc. Next, over the barrier film, an Al film is formed by the sputtering method etc. Then, over the Al film, a TiN film is formed as an antireflection film (not shown schematically) by the sputtering method etc.

Next, by patterning the stacked film of the barrier film, the Al film, and the antireflection film, the first layer wiring M1 is formed. Meanwhile, it may also be possible to form the plug P1 and the first layer wiring M1 at the same time by patterning after forming the contact hole and after forming the above-mentioned stacked film over the interlayer insulating film ID1 including the inside of the contact hole. By the above-described step, the first layer wiring M1 including Al as a principal component is formed. It should be noted that it may also be possible to handle the stacked film of the TiN film/Al film/TiN film as the first layer wiring M1 because the TiN film has conductivity.

Then, over the first layer wiring M1, for example, a silicon oxide film is deposited as an insulating film by the CVD method etc. and after that, as necessary, by polishing the surface of the silicon oxide film, the interlayer insulating film ID2 is formed.

Next, by etching the interlayer insulating film ID2, a contact hole is formed over the first layer wiring M1. Then, in the same manner as that of the plug P1, the plug P2 is formed by embedding a conductive film within the contact hole.

Then, over the interlayer insulating film ID2 including the top of the plug 2, in the same manner as that of the first layer wiring M1, a stacked film of the TiN film/Al film/TiN film is formed and the second layer wiring M2 is formed by patterning.

[Step of Forming Protection Insulating Film, Rewiring, and Pad Pattern]

Next, over the second layer wiring M2, the protection insulating films (21, 23, insulating film), the rewiring 31, etc., are formed. This step will be explained with reference to FIG. 2 to FIG. 12. In FIG. 2 to FIG. 12, the region in the vicinity of the uppermost layer wiring (here, the second layer wiring M2) and the opening OA1 of the rewiring 31 of the semiconductor device shown in FIG. 1 is shown in detail. In FIG. 2 to FIG. 12, in order to make the drawings easy-to-see, the second layer wiring M2 is represented to be shorter than the second layer wiring M2 shown in FIG. 1.

Figure 2:
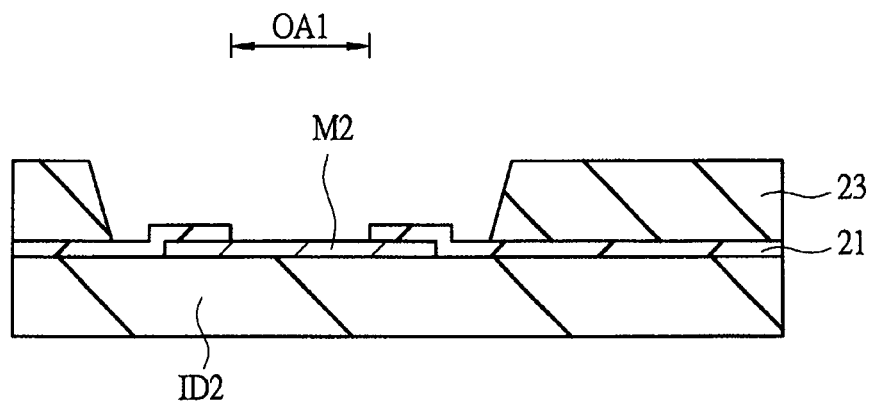
FIG. 2 is a cross-sectional view of essential parts showing a manufacturing step of the semiconductor device in the first embodiment.

First, as shown in FIG. 2, over the second layer wiring M2 and the interlayer insulating film ID2, as the first protection insulating film 21, for example, a stacked film of a silicon oxide film and a silicon nitride film is formed. For example, after depositing a silicon oxide film by the CVD method etc., by depositing a silicon nitride film on the upper part of the silicon oxide film by the CVD method etc., it is possible to form the above-mentioned stacked film.

Next, by applying a photoresist film (not shown schematically) over the first protection insulating film 21 and exposing/developing the photoresist film, the photoresist film of the opening OA1 is removed. Then, by etching the first protection insulating film (stacked film of silicon oxide film and silicon nitride film) 21 through the use of the remaining photoresist film as a mask, the opening OA1 is formed in the first protection insulating film 21. It is preferable to etch also the antireflection film located in the opening OA1. Because of this, from the opening (first pad region) OA1, the Al film configuring the second layer wiring M2 is exposed.

In this manner, the above-mentioned opening OA1 corresponds to the exposed part (exposed region) of the second layer wiring (Al film) M2 and serves as a coupling part (coupling region) of the second layer wiring (Al film) M2 and the rewiring 31.

Next, after removing the above-mentioned photoresist film, for example, a photosensitive polyimide film (PIQ film: Polyimide-isoindoloquinazolinedion film) is applied as the second protection insulating film 23 over the first protection insulating film including the top of the opening OA1. Then, by exposing/developing the photosensitive polyimide film, the photosensitive polyimide film in the region including at least the opening OA1 is removed. By this step, the second layer wiring (Al film) M2 is exposed again from the opening OA1. Next, by performing thermal processing (cure processing), the photosensitive polyimide is cured.

Figure 3:
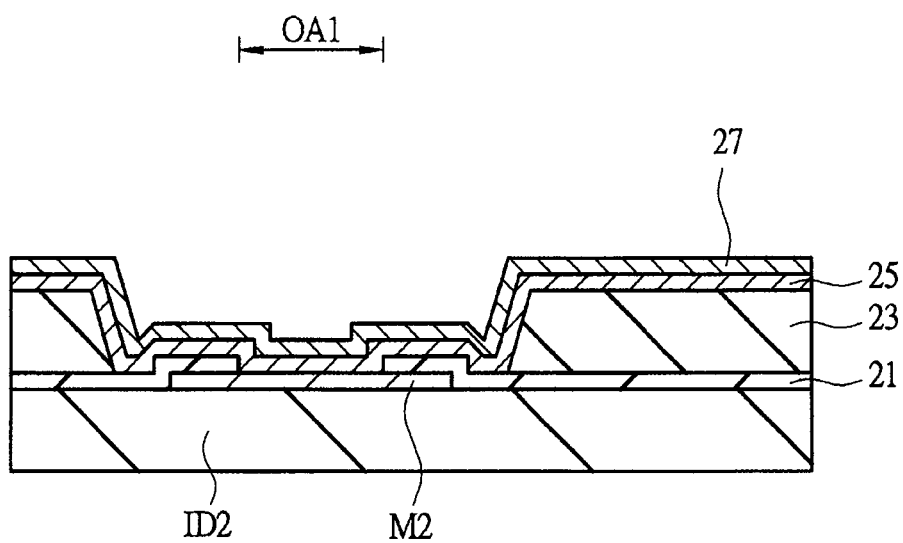
FIG. 3 is a cross-sectional view of essential parts showing the manufacturing step of the semiconductor device in the first embodiment, showing the step following that in FIG. 2.

Next, as shown in FIG. 3, over the second protection insulating film 23 including the top of the opening OA1, for example, a barrier film 25 including a chromium (Cr) film is deposited by the sputtering method etc. and further, over the barrier film 25, a thin film of copper (copper film) is formed as the Cu seed layer 27 for electrolytic plating by the sputtering method etc.

Figure 4:
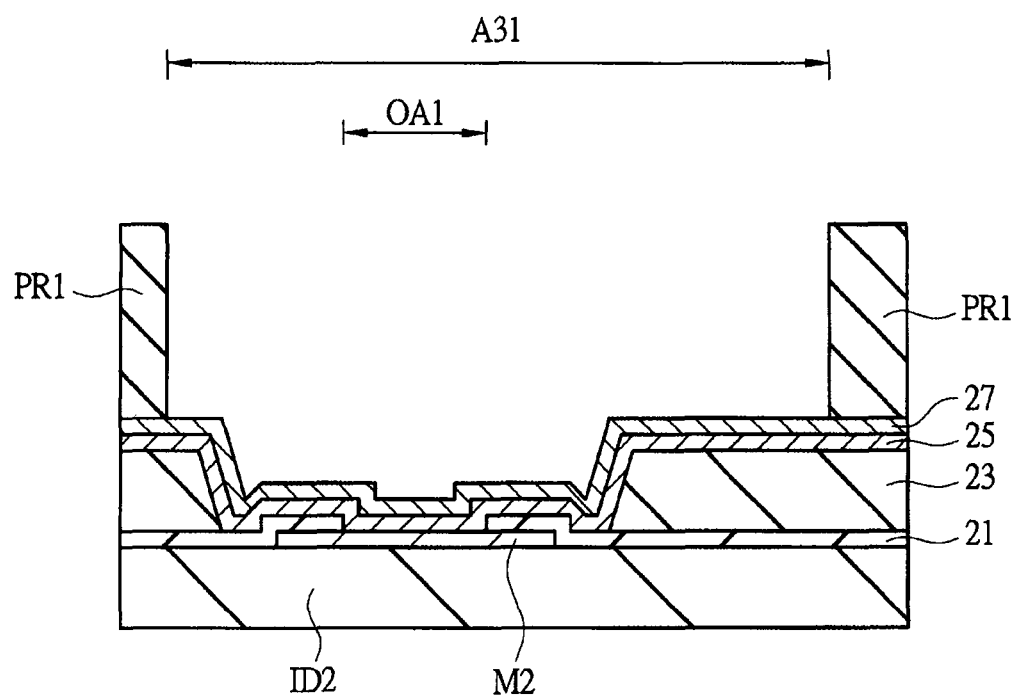
FIG. 4 is a cross-sectional view of essential parts showing the manufacturing step of the semiconductor device in the first embodiment, showing the step following that in FIG. 3.
Figure 5:
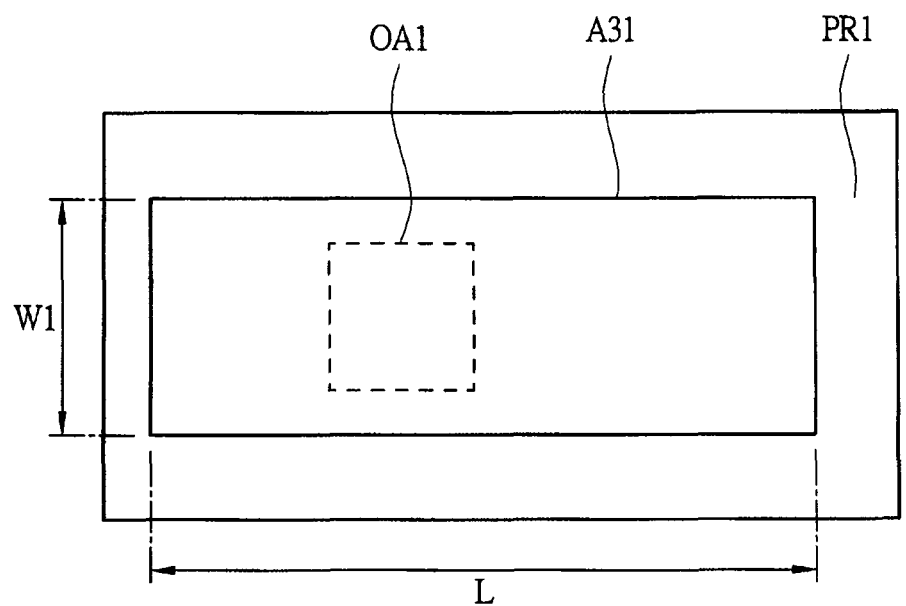
FIG. 5 is a plan view of essential parts showing the manufacturing step of the semiconductor device in the first embodiment.
Figure 6:
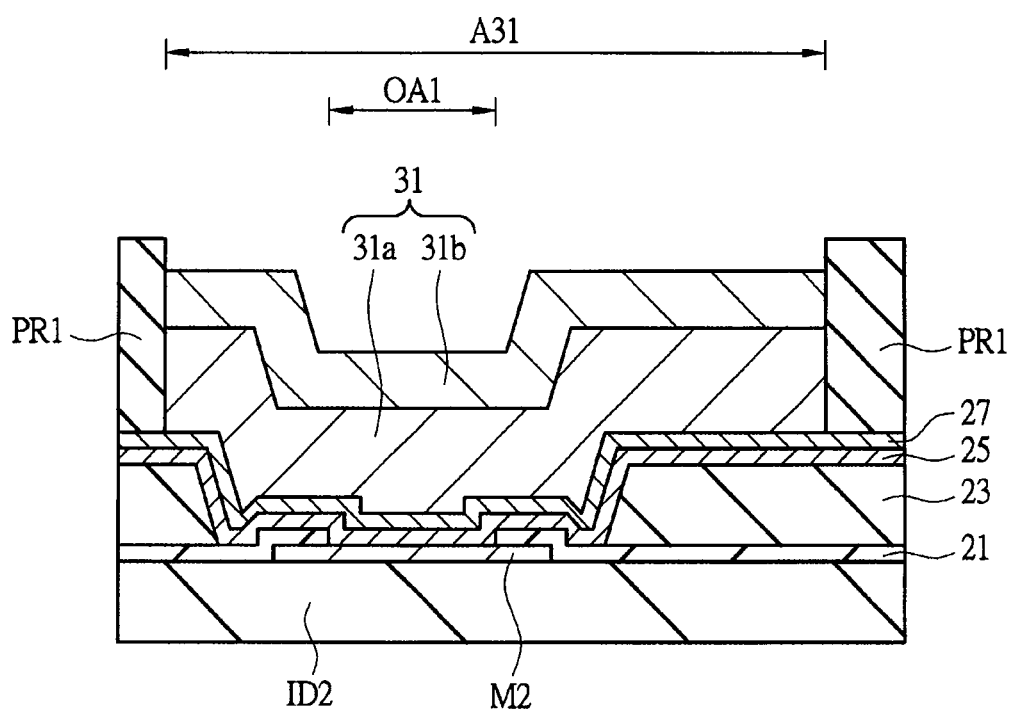
FIG. 6 is a cross-sectional view of essential parts showing the manufacturing step of the semiconductor device in the first embodiment, showing the step following that in FIG. 4.

Then, as shown in FIG. 4, by applying a photoresist film PR1 over the Cu seed film 27 and by exposing/developing the photoresist film PR1, the photoresist film PR1 in a rewiring formation region A31 is removed. As shown in FIG. 5, the rewiring formation region A31 is substantially a rectangular shape having a width W1 and a length L. The rewiring formation region A31 is a region including the opening OA1. Next, inside the remaining photoresist film (mask film) PR1, that is, over the Cu seed layer 27 of the rewiring formation region A31, the Cu film (copper film) 31a is formed by the electrolytic plating method. Then, inside the above-mentioned photoresist film PR1, that is, over the Cu film 31a of the rewiring formation region A31, the Ni film (nickel film) 31b is formed by the electrolytic plating method. As a result, a stacked film of the Cu film 31a and the Ni film 31b is formed as shown in FIG. 6. The film thickness of the Cu film 31a is, for example, about 8.0 μm. The film thickness of the Ni film 31b is, for example, about 10 nm to 3.5 μm, preferably, 3.0 μm or less.

Cu has a low resistance and the use of the Cu film 31a in the rewiring 31 is appropriate. By forming the Ni film 31b over the Cu film 31a, it is possible to protect the Cu film 31a and improve the corrosion resistance of the Cu film 31a. Furthermore, it is possible to reduce electromigration of the Cu film 31a.

Figure 7:
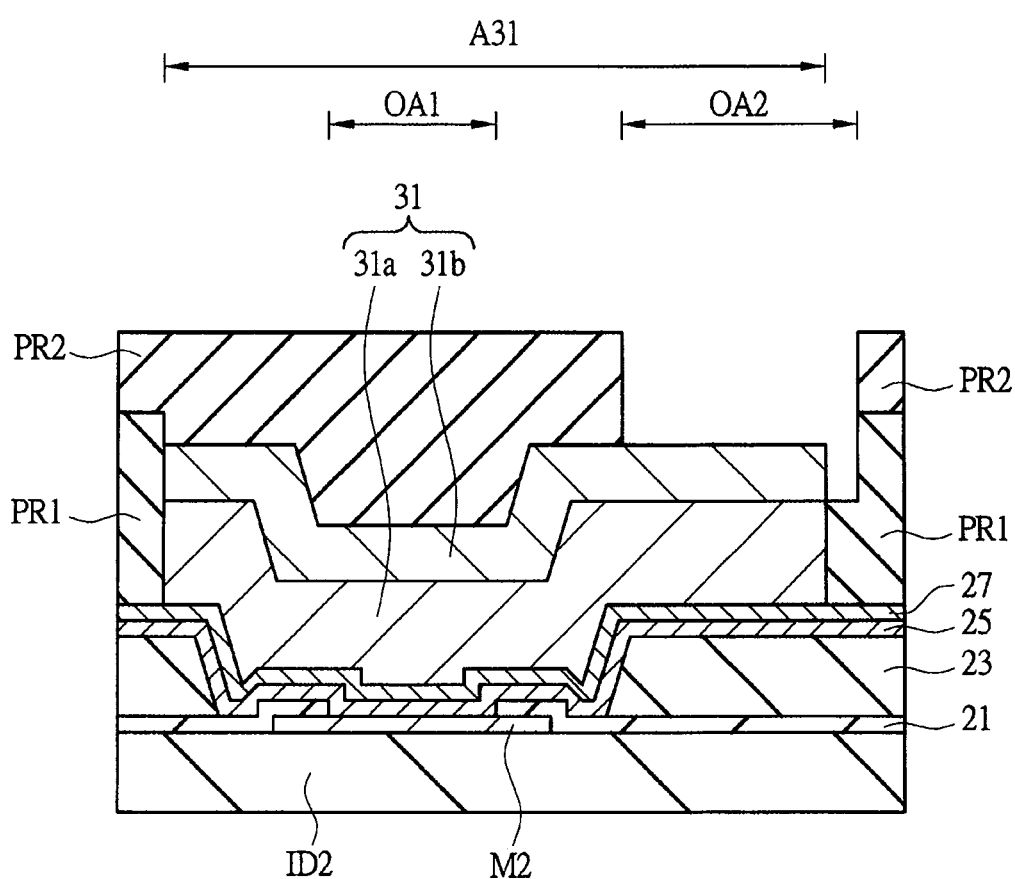
FIG. 7 is a cross-sectional view of essential parts showing the manufacturing step of the semiconductor device in the first embodiment, showing the step following that in FIG. 6.
Figure 9:
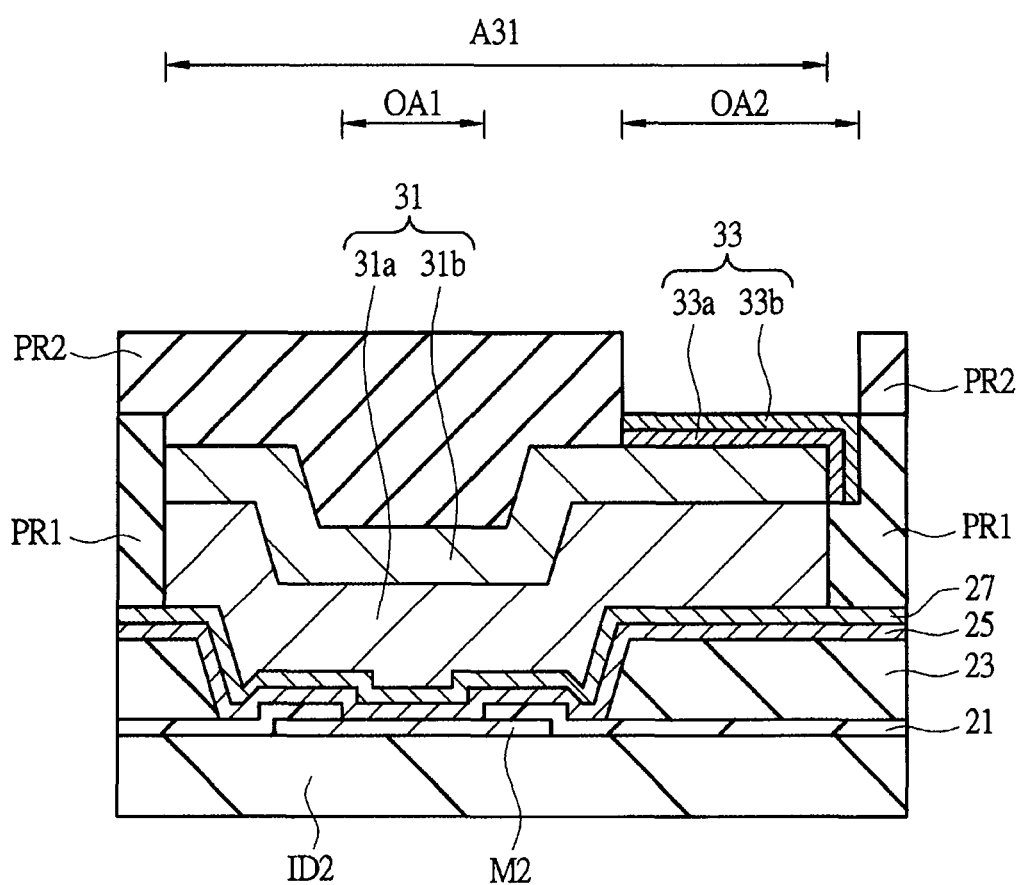
FIG. 9 is a cross-sectional view of essential parts showing the manufacturing step of the semiconductor device in the first embodiment, showing the step following that in FIG. 7.

Next, as shown in FIG. 7 to FIG. 9, over the end part of the rewiring 31, the pad pattern 33 is formed. The pad pattern 33 is formed by, for example, the following steps. First, as shown in FIG. 7, by applying a photoresist film (mask film) PR2 over the photoresist film PR1 including the rewiring formation region A31 and exposing/developing the photoresist film PR2, the photoresist film PR2 in the pad pattern formation region OA2 is removed. At this time, in the pad pattern formation region (opening) OA2, the photoresist film PR1 in the lower layer of the photoresist film PR2 is also removed.

That is, as shown in FIG. 8, the pad pattern formation region (pad region) OA2 is arranged over the end part region of the rewiring formation region A31. If the end part region of the rewiring formation region A31 is supposed to be a region having the width W1 and a length L1 (slashed part in FIG. 8), the pad pattern formation region OA2 is one size larger than the end part region. Specifically, the three sides of the above-mentioned end region in substantially the rectangular shape are set to be wider by an amount corresponding to width α. In other words, the region includes the above-mentioned end part region and its outer circumference (corresponding to width α) and has a width of (W1+2α) and a length of (L1+α).

Next, as shown in FIG. 9, inside the remaining photoresist film PR2, that is, over the Ni film 31b of the pad pattern formation region OA2 (not only the surface but also the side surface is included), the Ni film (nickel film) 33a is formed by the electrolytic plating method. Then, inside the above-mentioned photoresist film PR2, that is, over the Ni film 33a of a pad pattern formation region A33 (not only the surface but also the side surface is included), the Au film 33b is formed by the electrolytic plating method. The film thickness of the Ni film 33a is, for example, about 0.1 to 1 μm. In addition, the film thickness of the Au film 33b is, for example, about 1 to 3 μm.

By forming the pad pattern formation region OA2 one size larger than the end part region of the rewiring formation region A31 as described above (see FIG. 8), in the pad pattern formation region A33, the side surface (sidewall) that comes into contact with the three sides of the end part region of the rewiring formation region A31 is covered with the pad pattern 33 (see FIG. 8 and FIG. 9). Consequently, the contact area between the rewiring 31 and the pad pattern 33 increases and the adhesion improves. In other words, it is possible to reduce peeling of the pad pattern 33.

Figure 10:
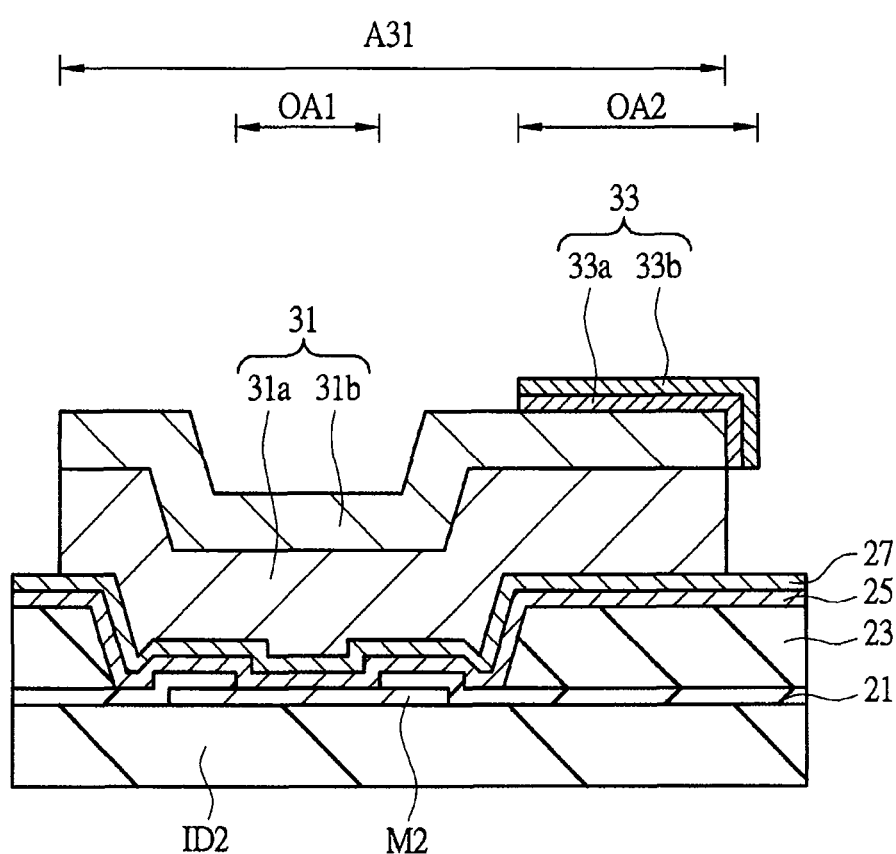
FIG. 10 is a cross-sectional view of essential parts showing the manufacturing step of the semiconductor device in the first embodiment, showing the step following that in FIG. 9.

Next, as shown in FIG. 10, the photoresist films PR1, PR2 are removed. As a result, in the rewiring formation region A31 and the pad pattern formation region OA2, the surfaces of the Ni film 31b and the Au film 33b and the side surfaces of the Cu film 31a, the Ni film 31b, the Au film 33b, and the Ni film 33a are exposed. Furthermore, in the region other than the rewiring formation region A31, the Cu seed layer 27 is exposed.

Figure 11:
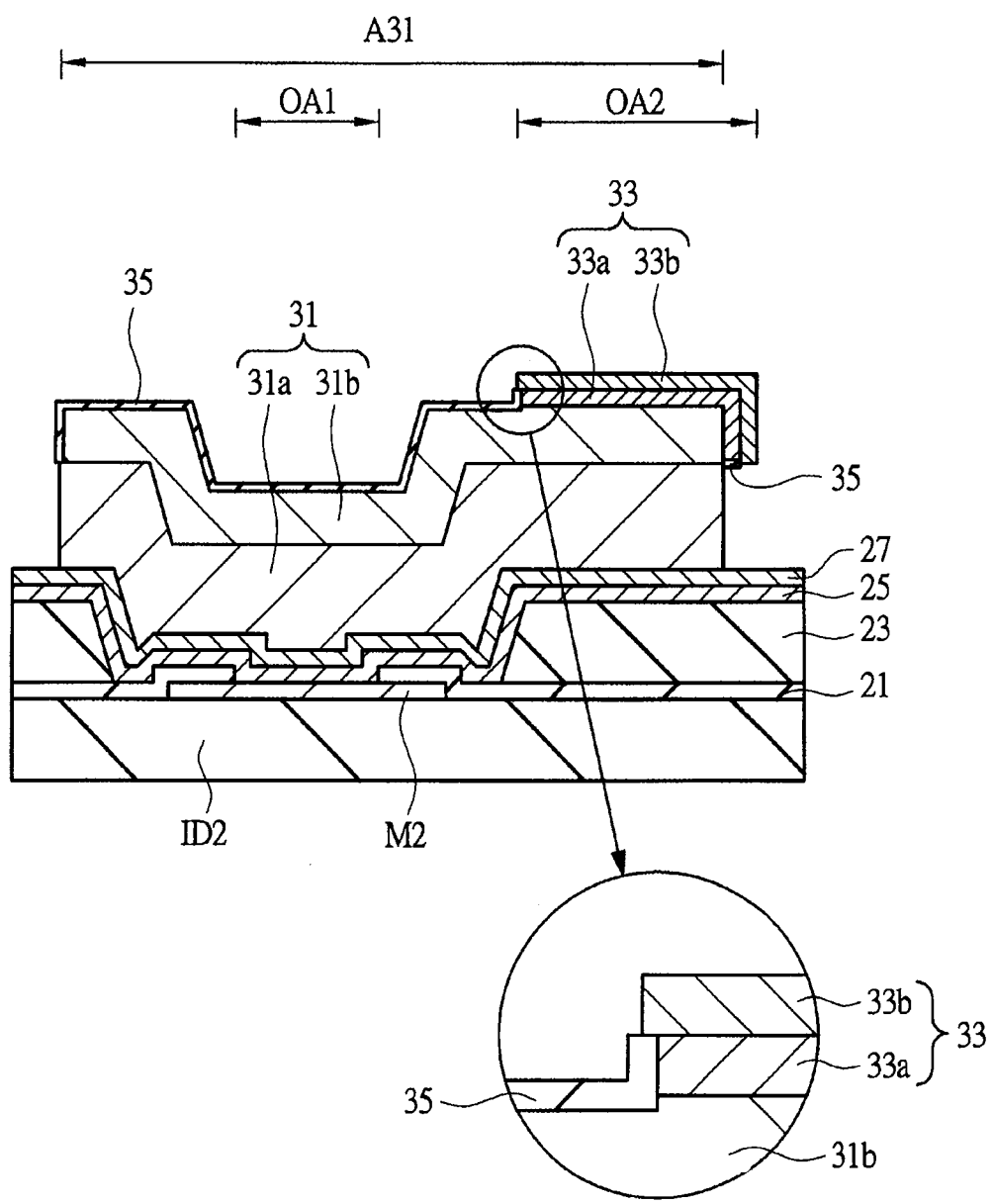
FIG. 11 is a cross-sectional view of essential parts showing the manufacturing step of the semiconductor device in the first embodiment, showing the step following that in FIG. 10.

Then, as shown in FIG. 11, the Ni films (31b, 33a) configuring the rewiring 31 and the pad pattern 33 are subjected to passivation processing. For example, by immersing the semiconductor substrate 1 in a processing liquid (ammonia/hydrogen peroxide mixture) containing ammonia and a hydrogen peroxide solution and bringing the Ni films (31b, 33a) into contact with the processing liquid, the passivation reaction (oxidation reaction) is caused to occur on the exposed surfaces of the Ni films (31b, 33a) and thus the Ni passivation film 35 is formed. At this time, it is possible to appropriately promote the passivation reaction by heating the processing liquid to a temperature equal to or higher than the room temperature (25° C.) or preferably, to 50° C. or higher.

As the processing liquid for passivation processing, it may also be possible to use a mixture containing hydrogen peroxide (processing liquid containing a hydrogen peroxide solution) other than the ammonia/hydrogen peroxide mixture. As another mixture containing hydrogen peroxide, it may also be possible to use a sulfuric acid/hydrogen peroxide mixture (processing liquid containing a sulfuric acid and a hydrogen peroxide solution). However, it is preferable to use a ammonia/hydrogen peroxide mixture because the sulfuric acid/hydrogen peroxide mixture may etch the Cu film (31a).

Furthermore, as the passivation processing, it may also be possible to use the plasma oxidation method. That is, it may also be possible to form the Ni passivation film 35 on the exposed surfaces of the Ni films (31b, 33a) by producing plasma in an oxidizing atmosphere (for example, an atmosphere containing oxygen), arranging the semiconductor substrate 1 inside the atmosphere, and causing the oxygen plasma (oxygen radical) to react with the Ni films (31b, 33a). Furthermore, it may also be possible to form the passivation film 35 by oxidizing and annealing in an atmosphere including oxygen (atmosphere in which a trace of oxygen (1% or less) is included in nitrogen) in a range of 150° C. to 400° C.

Figure 12:
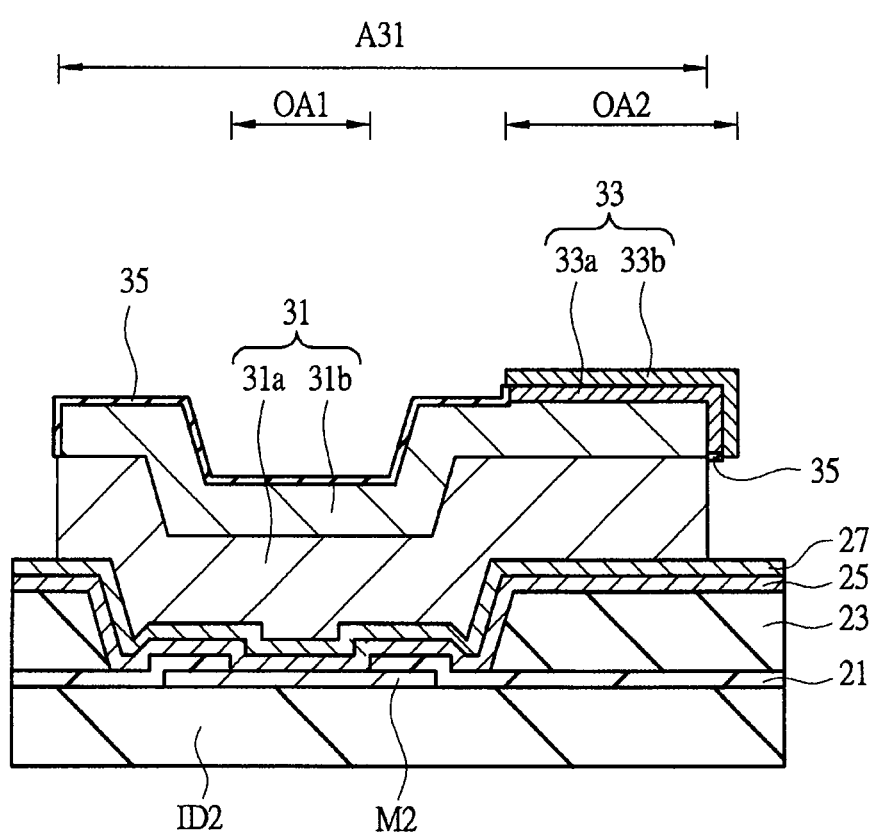
FIG. 12 is a cross-sectional view of essential parts showing the manufacturing step of the semiconductor device in the first embodiment, showing the step following that in FIG. 11.

Next, as shown in FIG. 12, by wet etching, the Cu seed layer 27 in the region other than a rewiring formation region A31 and the barrier film (Cr film) 25 in the lower layer thereof are removed sequentially.

Etching of the Cu seed layer 27 is performed by using an etchant containing a sulfuric acid/hydrogen peroxide mixture (solution containing a sulfuric acid and a hydrogen peroxide solution) or nitric acid/hydrogen peroxide mixture (solution containing a nitric acid and a hydrogen peroxide solution). After removing the Cu seed layer 27, the barrier film (Cr film) 25 is etched by, for example, using a solution containing potassium permanganate. It should be noted that when a Ti-based film (a single layer film including a TiN film or Ti film or a stacked film of these) is used as a barrier film, it is possible to perform etching by using an ammonia/hydrogen peroxide mixture.

Here, as an etchant of the above-mentioned Cu seed layer 27, a sulfuric acid/hydrogen peroxide mixture, nitric acid/hydrogen peroxide mixture, etc., are used, and thus not only Cu but also Ni is dissolved. However, in the present embodiment, the Ni passivation film 35 is formed on the surfaces of the Ni films (31b, 33a), and thus it is possible to prevent etching (reduction in film thickness) of the Ni films (31b, 33a).

As a result, the following effects are achieved.

(1) By preventing etching of the Ni films (31b, 33a), it is possible to form the Ni films (31b, 33a) thin from the first, and to thereby suppress costs.

(2) If the Ni films (31b, 33a) are formed thick (for example, about 1.0 μm) in view of the reduction in film thickness of the Ni films (31b, 33a) (according to the examination of the inventors of the present invention, about 0.8 μm), the stress of the film (film stress) increases and distortion occurs in the semiconductor substrate 1. As a result, in the processing step, such as the exposure step, the transportation step between processing devices, etc., during the period from the film formation of the Ni film 31b to the step of etching the above-mentioned Cu seed layer 27, an error in fixation and transportation of the semiconductor substrate 1 occurs. As a result, throughput (processing performance per unit time) of the manufacturing step is reduced. Furthermore, when the distortion is large, a defect occurs and manufacturing yields are reduced. In addition, this may lead to deterioration of the characteristics of the semiconductor elements (for example, Qn, Qp, etc.) in the lower layer, breakage of the wirings (for example, M1, M2), etc. In contrast to this, in the present embodiment, as described above, it is possible to form the Ni films (31b, 33a) thin in advance, and thus it is possible to avoid the above-mentioned trouble.

Moreover, when the amount of reduction in film thickness is set to be somewhat larger in view of the variation in etching, the film thickness of the Ni film remaining after the etching step of the Cu seed layer 27 also becomes greater than a desired film thickness. As a result, in the subsequent steps, the state where film stress is large lasts. Because of this, in the subsequent steps such as a probe test step and laser relief step (fuse programming step), to be described later, an error in fixation (for example, fixation by adsorption) and transportation of the semiconductor substrate 1 may occur. Also in such a case, the throughput of the manufacturing step is reduced.

In contrast to this, in the present embodiment, it is possible to optimize the thickness of the Ni films (31b, 33a), and thus it is possible to improve the throughput of the manufacturing step and improve the characteristics of a semiconductor device by reducing the film stress of the Ni films (31b, 33a).

(3) Furthermore, the Ni passivation film 35 is formed also on the side surface of the pad pattern 33 (see FIG. 11), and thus it is possible to reduce side etching of the Ni film 33a. That is, when the Ni passivation film 35 is not formed, the side surface of the Ni film 33a of the pad pattern 33 is exposed to the sulfuric acid/hydrogen peroxide mixture or nitric acid/hydrogen peroxide mixture, and thus etching (erosion) of the Ni film advances from the above-mentioned side surface. This eroded part serves as a base point and the pad pattern 33 becomes easy to be peeled off. In particular, the pad pattern 33 is easy to be peeled off because the pattern area is small. In contrast to this, in the present embodiment, it is possible to reduce side etching of the Ni film 33a and reduce peeling of the pad pattern 33.

[Probe Test and Fuse Programming Steps]

After that, as necessary, an operation test of the semiconductor device is conducted by utilizing the pad pattern 33. To determine whether or not a semiconductor device (integrated circuit) etc. are excellent in quality in the previous step (before dicing, in a state of wafer) of the manufacturing step of a semiconductor device is referred to as a "wafer test".

This wafer test includes, for example, a "probe test" conducted by using a probe card provided with a probe needle corresponding to the pad pattern 33. By applying an electric signal to the pad pattern 33 via the probe needle and detecting a signal obtained from the pad pattern 33, it is possible to check the electrical characteristics of the semiconductor device. Based on the rest result, it is possible to determine whether or not the semiconductor device (integrated circuit) is excellent in quality.

Next, as necessary, programming of a fuse element is performed. For example, in the same layer as the wiring (M1 or M2), a fuse element (not shown schematically) formed by the same conductive member is provided. The interlayer insulating films (ID1, ID2) and the protection insulating films (21, 23) over the fuse element are thinned by etching. After that, the fuse element to be cut is irradiated with a high-energy beam, such as laser, and thereby the fuse element is cut. By performing programming based on the presence/absence of the cut of the fuse element, for example, it is possible to relieve a defect (redundancy relief) based on the above-mentioned probe test result and perform switching of circuits corresponding to the specifications (frequency, corresponding voltage) of the semiconductor device.

In the above-mentioned probe test step and fuse programming step also, the distortion of the semiconductor substrate 1 is reduced in the present embodiment, and thus an error in fixation (for example, fixation by adsorption) and transportation of the semiconductor substrate 1 is reduced.

[Mounting Step]

Next, by cutting (dicing) the semiconductor substrate (wafer) 1, it is separated (singulated) into a plurality of semiconductor chips. It should be noted that before dicing, it may also be possible to grind the back surface of the semiconductor substrate (wafer) 1 to thereby thin the semiconductor substrate 1. Next, the semiconductor chip is mounted (bonded) over the wiring substrate (mounting substrate) (die bonding). On the side of the wiring substrate, on which the chip is mounted, the external coupling terminals (external terminal, terminal) are formed. Next, the pad pattern 33 over the semiconductor chip and the external coupling terminal formed on the wiring substrate are coupled by the wire (conductive lead, conductive material) W including a gold wire etc. (wire bonding).

After that, as necessary, the semiconductor chip and the wire are sealed so as to be covered with a sealing resin (mold resin) or the like.

Meanwhile, in the present embodiment, the pad pattern 33 is configured by the stacked film of the Ni film 33a and the Au film 33b, but it may also be possible to omit the Ni film 33a. That is, it may also be possible to form the Au film 33b directly inside the photoresist film PR2, in other words, on the Ni film 31b of the pad pattern formation region OA2 (not only its surface but also the side surface is included) by the electrolytic plating method.

However, by providing the Ni film 33a in the lower layer of the Au film 33b and performing electrolytic processing continuously, the adhesion of the Au film 33b and the Ni film 33a further improves, and thus it is possible to reduce peeling of the Au film 33b.

Furthermore, the pad pattern 33 is formed by using the electrolytic plating method, but it may also be formed by using the electroless plating method. However, when the film thickness of the Au film 33b is comparatively great, the use of the electrolytic plating method is appropriate.

Second Embodiment

In the first embodiment, over the end part of the rewiring 31, the pad pattern 33 is provided and the pad pattern 33 and the external coupling terminal, such as the wiring substrate, are coupled by the wire W (see FIG. 1), but it may also be possible to provide a bump electrode BP over the end part of the rewiring 31 (see FIG. 13) and couple the bump electrode BP, and the external coupling terminal such as the wiring substrate.

Figure 13:
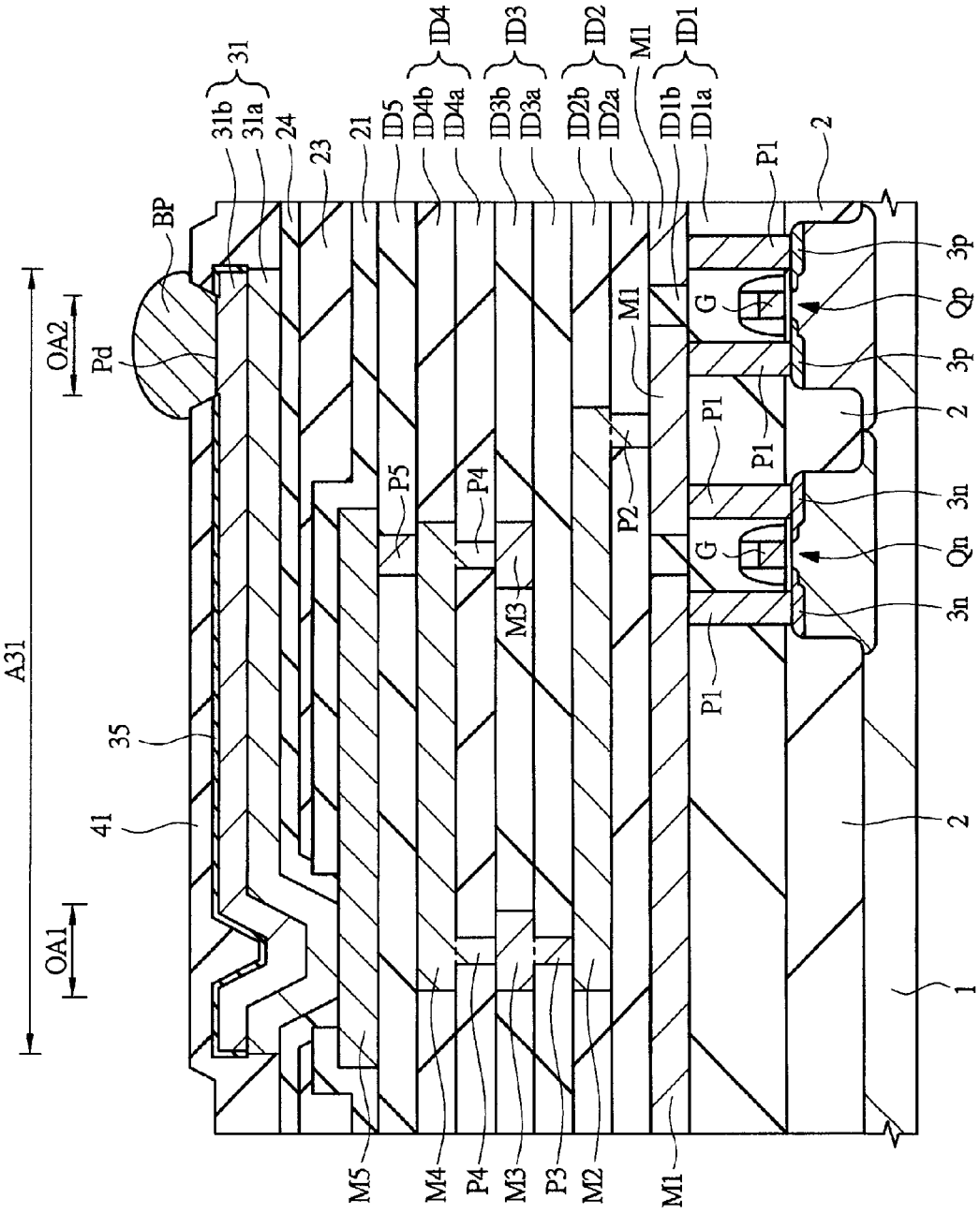
FIG. 13 is a cross-sectional view of essential parts showing a configuration of a semiconductor device in a second embodiment.

Hereinafter, with reference to the drawings, a configuration of a semiconductor device and a manufacturing method thereof in the present embodiment will be explained in detail. FIG. 13 is a cross-sectional view of essential parts showing the configuration of the semiconductor device in the present embodiment. FIG. 14 to FIG. 23 are cross-sectional views of essential parts showing the manufacturing steps of the semiconductor device in the present embodiment.

[Explanation of Structure]

First, with reference to FIG. 13, a characteristic structure of the semiconductor device in the present embodiment will be explained.

As shown in FIG. 13, the semiconductor device in the present embodiment also has, for example, the p-channel type MISFET Qp and the n-channel type MISFET Qn as semiconductor elements formed over the semiconductor substrate (substrate) 1 as in the first embodiment. Besides the MISFETs described above, the semiconductor device may have various kinds of other elements, such as capacitor elements, resistor elements, and memory cells. Over these MISFETs, the interlayer insulating film ID1 is arranged. Furthermore, over the source/drain regions (3n, 3p) of the MISFET, the first layer wiring M1 is arranged via the plug P1.

Over the first layer wiring M1, a plurality of wiring layers (the second layer wiring M2 to fourth layer wiring M4) are arranged. Each wiring layer is electrically coupled by the plug P2 to the plug P4 and other regions are electrically insulated by the interlayer insulating film ID2 to an interlayer insulating film ID4. The first layer wiring M1 to the fourth layer wiring M4 are Cu wirings including a conductive film including Cu as a principal component, that is, so-called damascene wirings.

A fifth layer wiring M5, which is the uppermost layer wiring, is an Al wiring including a conductive film including Al as a principal component. It should be noted that the first layer wiring M1 to the fourth layer wiring M4 may include the Al wiring.

Over the fifth layer wiring (uppermost layer wiring) M5, the protection insulating films (21, 23, insulating film) and a protection insulating film (24, insulating film) are formed and from the opening of the protection insulating film (here, the opening of the third protection insulating film 24) OA1, the fifth layer wiring (Al film) M5 is exposed.

From the exposed part (the opening OA1, first pad region), the rewiring 31 is arranged over the protection insulating films (21, 23, and 24). The rewiring 31 plays a role in routing the exposed part (the opening OA1, first pad region) to a desired region over the semiconductor substrate (semiconductor chip). As described above, by using the rewiring 31 and using the end part of the rewiring 31 as the pad region (opening OA2, second pad region) Pd, it is possible to couple electrically the external coupling terminal such as the wiring substrate, and the semiconductor substrate (semiconductor chip) easily.

The rewiring 31 includes a stacked film of the copper film (conductive film including Cu as a principal component) 31a and the nickel film (conductive film including Ni as a principal component) 31b. The Cu film 31a is a film grown by plating from a thin copper film, which is the seed layer in the lower layer, and in the lower layer of the Cu film 31a, a seed layer (not shown schematically in FIG. 13. See FIG. 23) is arranged. At the lower part of the seed layer, a barrier layer (not shown schematically in FIG. 13. See FIG. 23) is arranged. It should be noted that the Ni film 31b is a film grown by plating over the Cu film 31a. Meanwhile, hereinafter, the seed layer (seed film) 27 is sometimes referred to as the Cu seed layer 27. The Cu seed layer and the barrier film also have conductivity, and thus they can be considered to be included in the rewiring 31.

Over the above-mentioned rewiring 31 (the Ni film 31b), a surface protection insulating film (41, insulating film) is arranged and from the opening OA2 of the surface protection insulating film 41, the rewiring 31 is exposed. Within the opening OA2, an Au film (not shown schematically in FIG. 13, see FIG. 23) is formed. The opening OA2 serves as the pad region Pd. Over the pad region Pd, the bump electrode (protruding electrode) BP is arranged and electrical coupling between the external coupling terminal, such as a wiring substrate described later, and the semiconductor device is ensured via the bump electrode BP.

Here, as the characteristic configuration of the semiconductor device in the present embodiment, on the surface of the Ni film 31b configuring the rewiring 31, in the region other than the opening OA2, the Ni passivation film 35 is arranged. In other words, in the region sandwiched by the Ni film 31b and the surface protection insulating film (41, insulating film), the Ni passivation film 35 is arranged.

As described above, by arranging the Ni passivation film 35, the corrosion resistance of the Ni film 31b is improved. Furthermore, as will be explained in detail in a manufacturing step, to be described later, it is possible to reduce the reduction in film thickness of the Ni film 31b when etching the Cu seed layer 27. Consequently, it is possible to form the Ni film 31b thin in advance and reduce stress applied to the wiring, element (MISFET), etc., in the lower layer.

[Explanation of Manufacturing Method]

Next, with reference to FIG. 13 to FIG. 23, the manufacturing step of the semiconductor device in the present embodiment will be explained and at the same time, the configuration of the semiconductor device is made clearer.

First, the semiconductor substrate 1 on which a plurality of the wirings (M1 to M5) are formed above the semiconductor elements (the n-channel type MISFET Qn and the p-channel type MISFET Qp) as shown in FIG. 13 is prepared.

[Step of Forming Qn, and Qp]

There are no limitations on the forming method of the semiconductor elements (the n-channel type MISFET Qn and the p-channel type MISFET Qp) and, for example, it is possible to form the n-channel type MISFET Qn and the p-channel type MISFET Qp by the steps explained in the first embodiment (see FIG. 13, FIG. 1).

[Step of Forming M1 to M4]

There are no limitations on the forming method of a plurality of wirings (M1 to M4) and these can be formed by, for example, steps shown below (see FIG. 13).

First, over the n-channel type MISFET Qn and the p-channel type MISFET Qp shown in FIG. 13 described earlier, for example, a silicon oxide film is deposited as an insulating film by the CVD method. After that, as necessary, by polishing the surface of the silicon oxide film to flatten the surface by the chemical mechanical polishing method, an interlayer insulating film ID1a is formed.

Next, by etching the interlayer insulating film ID1a, a contact hole (coupling hole) is formed over the source/drain regions 3n, 3p, respectively. Next, over the interlayer insulating film ID1a including the inside of the contact hole, a W film is deposited as a conductive film by the CVD method, and the conductive film is embedded within the contact hole by polishing the W film by the CMP method until the interlayer insulating film ID1a is exposed. By this step, the plug (coupling part, contact plug) P1 is formed. It may also be possible to provide a barrier film including a single layer film of, for example, a TiN film, Ti film, etc., or a stacked film made up of these, in the lower layer of the W film.

Then, over the interlayer insulating film ID1a and the plug P1, for example, a silicon nitride film and a silicon oxide film are deposited sequentially as an insulating film by the CVD method, and thus a wiring groove insulating film ID1b including a stacked film of these is formed. It should be noted that the silicon nitride film serves as an etching stopper film. In addition, both of the above-mentioned interlayer insulating film ID1a and the wiring groove insulating film ID1b may be referred to as the interlayer insulating film ID1 in some cases (this also applies to ID2 to ID4).

Next, by etching the wiring groove insulating film ID1b, a wiring groove is formed. Next, a barrier film (not shown schematically) including, for example, titanium nitride is deposited over the wiring groove insulating film ID1b including the inside of the wiring groove by the sputter method and further, over the barrier film, for example, a thin film of copper is formed as a Cu seed layer (not shown schematically) for electrolytic plating by the sputter method or CVD method. Next, over the Cu seed layer, for example, a copper film is formed as a conductive film by the electrolytic plating method.

Then, by removing the copper film and barrier film other than the wiring groove by the CMP method, the first layer wiring M1 is formed. The method for embedding a conductive film inside the wiring groove in this manner is referred to as the damascene method and in particular, the method for forming the plug and the wiring in different steps is referred to as the single damascene method. Furthermore, the method for forming the plug and the wiring at one time by embedding a conductive film within the contact hole and the wiring groove at the same time, which is used to form the second layer wiring M2 to the fourth layer wiring M4, to be described later, is referred to as the dual damascene method.

Next, by using the dual damascene method, the second layer wiring M2 to the fourth layer wiring M4 are formed. First, by sequentially depositing, for example, a silicon nitride film, a silicon oxide film, a silicon nitride film, and a silicon oxide film as an insulating film over the first layer ing M1 and the wiring groove insulating film ID1b by the CVD method, the interlayer insulating film ID2 is formed. Among these films, the silicon nitride film in the lower layer has a function to prevent diffusion of copper configuring the first layer wiring M1. Furthermore, the silicon nitride film in the lower layer is utilized as an etching stopper when forming a contact hole, to be described later, and the silicon nitride in the upper layer is utilized as an etching stopper when forming a wiring groove, to be described later.

Next, by etching a stacked film ID2b of the silicon oxide film and the silicon nitride film, which are the insulating films in the two layers from the top of the interlayer insulating film ID2, a wiring groove is formed. Then, by depositing a first photoresist film (not shown schematically) over the interlayer insulating film ID2 including the inside of the wiring groove and etching it back, the wiring groove is filled with the first photoresist film. Furthermore, by forming a second photoresist film (not shown schematically) in which a formation region of the plug P2, to be described later, is opened over the first photoresist film and etching the first photoresist film and a stacked film ID2a of the silicon oxide film and the silicon nitride film in the two layers from the bottom using the second photoresist film as a mask, a contact hole is formed.

Meanwhile, here, after forming the wiring groove, the contact hole is formed, but it may also be possible to form the wiring groove by etching the stacked film ID2b of the silicon oxide film and the silicon nitride film, which are the insulating films in the two layers from the top after forming the contact hole by etching the interlayer insulating film ID2 (four-layer film, ID2a and ID2b) in the formation region of the plug P2.

Next, over the interlayer insulating film ID2 including the contact hole and the inside of the wiring groove, for example, a barrier film (not shown schematically) including titanium nitride is deposited by the sputter method and further, over the barrier film, for example, a thin film of copper is formed as a Cu seed layer (not shown schematically) for electrolytic plating by the sputter method or CVD method. Next, over the Cu seed layer, for example, a copper film is formed as a conductive film by the electrolytic plating method.

Then, by removing the copper film and the barrier film other than the wiring groove by the CMP method, the plug P2 and the second layer wiring M2 are formed.

Next, in the same manner as that of the interlayer insulating film ID2 (ID2a, ID2b), the plug P2, and the second layer wiring M2, an interlayer insulating film ID3 (ID3a, ID3b), the plug P3, and the third layer wiring M3 are formed. Furthermore, in the same manner as that of the interlayer insulating film ID2 (ID2a, ID2b), the plug P2, and the second layer wiring M2, an interlayer insulating film ID4 (ID4a, ID4b), the plug P4, and the fourth layer wiring M4 are formed.

Then, over the fourth layer wiring M4, an interlayer insulating film ID5 is formed, for example, in the same manner as that of the interlayer insulating film ID1a and within the interlayer insulating film ID5, a plug P5 is formed in the same manner as that of the plug P1. Furthermore, over the interlayer insulating film ID5 and the plug 5, the fifth layer wiring (Al wiring) M5 is formed.

For example, over the interlayer insulating film ID5 and the plug P5, as a barrier film (not shown schematically), for example, a TiN film is formed by the sputtering method etc. and next, over the barrier film, an Al film is formed by the sputtering method and further, over the Al film, as an antireflection film (not shown schematically), a TiN film is formed by the sputtering method etc.

Next, by patterning the stacked film of the barrier film, the Al film, and the antireflection film, the fifth layer wiring M5 is formed. Meanwhile, it may also be possible to form the plug 5 and the fifth layer wiring M5 at the same time by patterning after forming the contact hole and after forming the stacked film over the interlayer insulating film ID5 including the inside of the contact hole. By the above-mentioned step, the fifth layer wiring M5 including Al as a principal component is formed. The TiN film has conductivity, and thus it may also be possible to handle the stacked film of the TiN film/Al film/Tin film as the fifth layer wiring M5.

[Step or the Like of Forming Protection Insulating Film, Rewiring, and Pad Pattern]

Next, over the fifth layer wiring M5, the protection insulating films (21, 23, 24, and insulating film), the rewiring 31, etc., are formed. This step will be explained with reference to FIG. 14 to FIG. 23. In FIG. 14 to FIG. 23, the region in the vicinity of the uppermost layer wiring (here, the fifth layer wiring M5) and the opening OA1 of the rewiring 31 of the semiconductor device shown in FIG. 1 is shown in detail. In FIG. 14 to FIG. 23, in order to make the drawings easy-to-see, the fifth layer wiring M5 is represented shorter than the fifth layer wiring M5 shown in FIG. 13.

Figure 14:
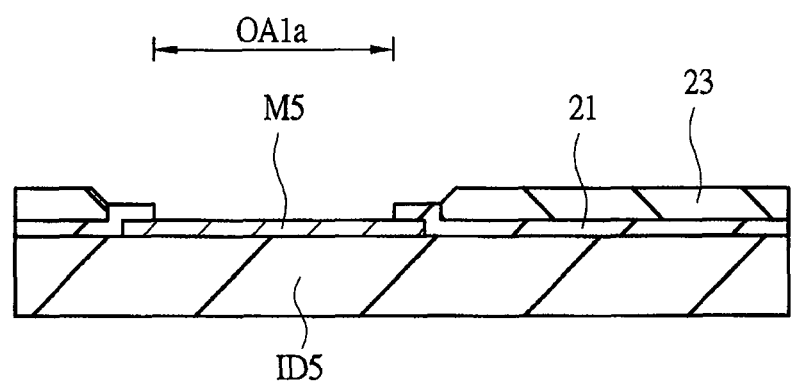
FIG. 14 is a cross-sectional view of essential parts showing a manufacturing step of a semiconductor device in the second embodiment.

First, as shown in FIG. 14, over the fifth layer wiring M5 and the interlayer insulating film ID5, as the first protection insulating film 21, for example, a stacked film of a silicon oxide film and a silicon nitride film is formed. For example, after depositing a silicon oxide film by the CVD method etc., by depositing a silicon nitride film on the upper part of the silicon oxide film by the CVD method etc., it is possible to form the above-mentioned stacked film.

Next, by patterning the first protection insulating film 21, an opening OA1a is formed. It should be noted that it is preferable to etch also the antireflection film located in the opening OA1a. By doing so, from the opening OA1a, the Al film configuring the fifth layer wiring M5 is exposed.

Then, over the first protection insulating film 21 including the top of the opening OA1a, as the second protection insulating film 23, for example, a photosensitive polyimide film is applied. Next, by exposing/developing the photosensitive polyimide film, the photosensitive polyimide film in the region including the opening OA1a is removed. By this step, from the opening OA1a, the fifth layer wiring (Al film) M5 is exposed again.

Figure 15:
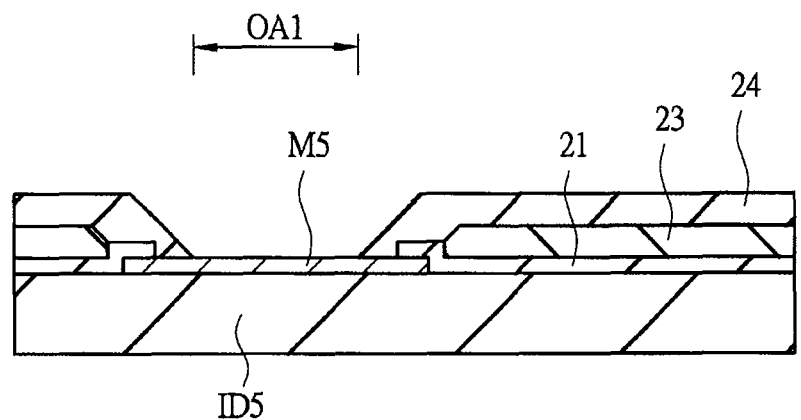
FIG. 15 is a cross-sectional view of essential parts showing the manufacturing step of the semiconductor device in the second embodiment, showing the step following that in FIG. 14.

Then, as shown in FIG. 15, over the first and second protection insulating films (21, 23) including the top of the opening OA1a, as the third protection insulating film 24, for example, a photosensitive polyimide film is applied. Next, by exposing/developing the photosensitive polyimide film to remove the photosensitive polyimide within the opening OA1a, the opening OA1 is formed. By this step, from the opening OA1, the fifth layer wiring (Al film) M5 is exposed again. Next, by performing thermal processing (cure processing), the photosensitive polyimide films (23, 24) are cured. It should be noted that in the above-mentioned step, the opening OA1a is formed larger than OA1, but it may also be possible to form the opening OA1a about the same size as the opening OA1. That is, it is sufficient to set the configuration so that a desired region of the protection insulating films (21, 23, and 24) is opened and the fifth layer wiring (Al film) M5 is exposed. The desired region (in FIG. 15, the opening OA1) serves as the coupling part (coupling region) between the fifth layer wiring (Al film) M5 and the rewiring 31.

Figure 16:
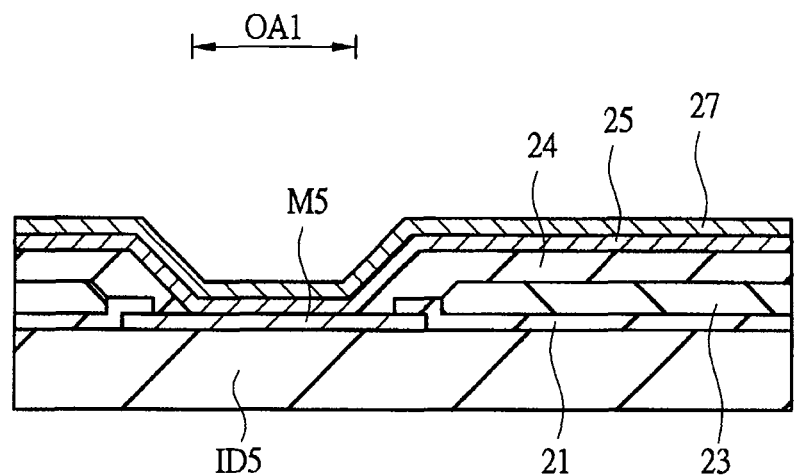
FIG. 16 is a cross-sectional view of essential parts showing the manufacturing step of the semiconductor device in the second embodiment, showing the step following that in FIG. 15.

Then, as shown in FIG. 16, over the third protection insulating film 24 including the top of the above-mentioned opening OA1, for example, the barrier film 25 including a Cr film or a stacked film (Ti-based film) of Ti/TiN/Ti is deposited by the sputtering method etc. and further, over the barrier film 25, a thin film of copper (copper film) is formed as the Cu seed layer 27 for electrolytic plating by the sputtering method etc.

Figure 17:
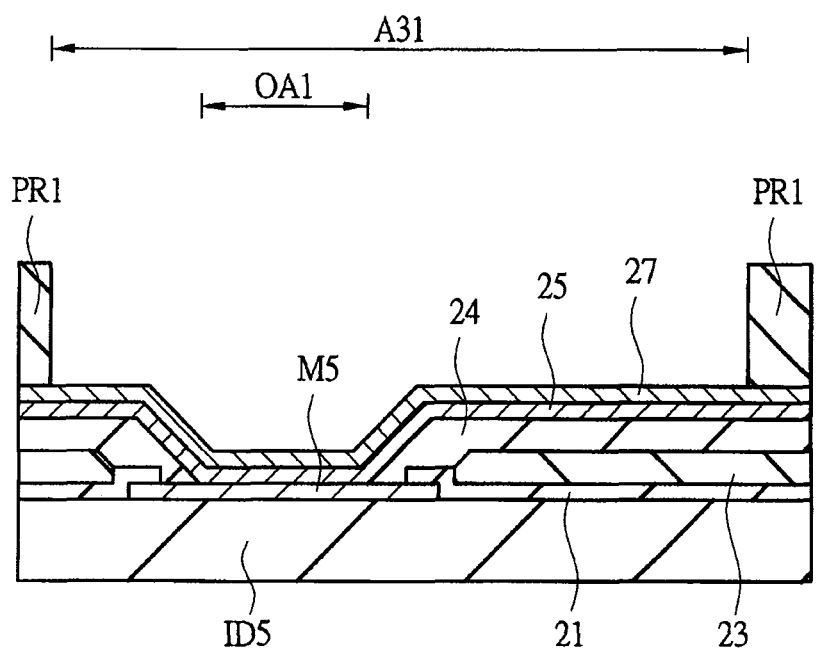
FIG. 17 is a cross-sectional view of essential parts showing the manufacturing step of the semiconductor device in the second embodiment, showing the step following that in FIG. 16.

Next, as shown in FIG. 17, by applying the photoresist film PR1 over the Cu seed layer 27 and exposing/developing the photoresist film PR1, the photoresist film PR1 in the rewiring formation region 31 is removed. The rewiring formation region 31 is a region including the opening OA1.

Figure 18:
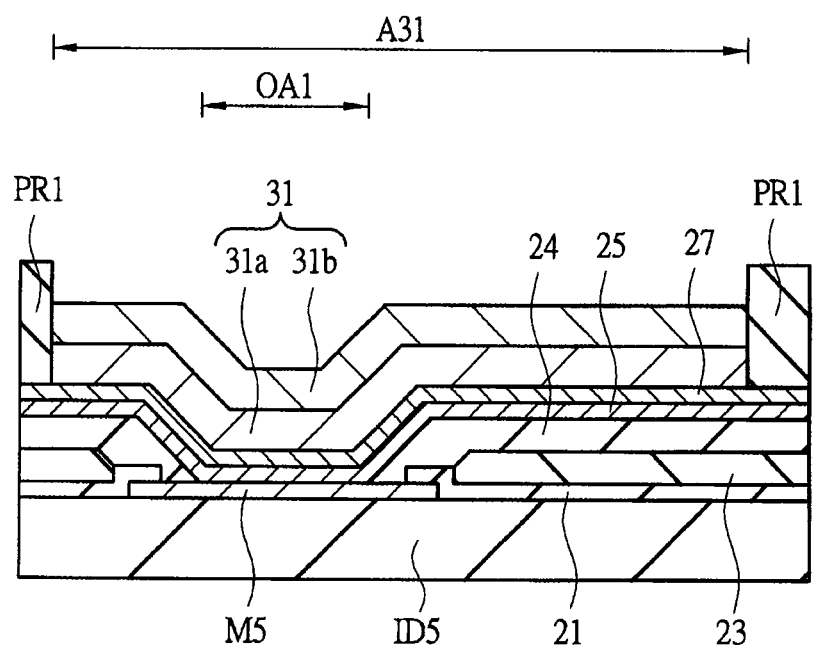
FIG. 18 is a cross-sectional view of essential parts showing the manufacturing step of the semiconductor device in the second embodiment, showing the step following that in FIG. 17.

Then, as shown in FIG. 18, inside the remaining photoresist film (mask film) PR1, that is, over the Cu seed layer 27 in the rewiring formation region A31, the Cu film (copper film) 31a is formed by the electrolytic plating method. Next, inside the above-mentioned photoresist film PR1, that is, over the Cu film 31a in the rewiring formation region A31, the Ni film (nickel film) 31b is formed by the electrolytic plating method. The film thickness of the Cu film 31a is, for example, about 4 to 7 μm. In addition, the thickness of the Ni film 31b is about 2 to 4 μm.

Cu has a low resistance, and thus the use of the Cu film 31a in the rewiring 31 is appropriate. Furthermore, by forming the Ni film 31b over the Cu film 31a, it is possible to protect the Cu film 31a and improve the corrosion resistance of the Cu film 31a. Furthermore, it is possible to reduce electromigration of the Cu film 31a.

Figure 19:
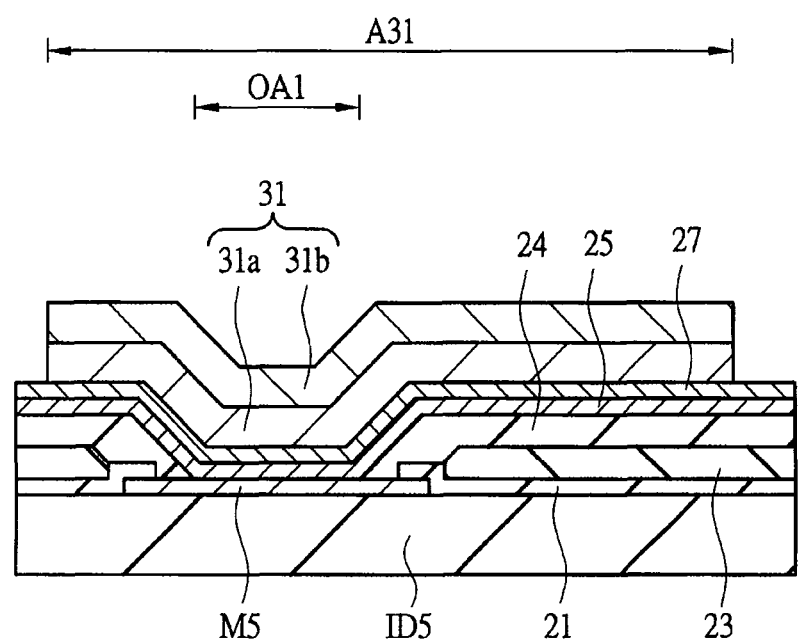
FIG. 19 is a cross-sectional view of essential parts showing the manufacturing step of the semiconductor device in the second embodiment, showing the step following that in FIG. 18.

Next, as shown in FIG. 19, the photoresist film PR1 is removed. As a result, in the rewiring formation region A31, the upper surface of the Ni film 31b and the side surfaces of the Cu film 31a and the Ni film 31b are exposed and in the region other than the rewiring formation region A31, the Cu seed layer 27 is exposed.

Figure 20:
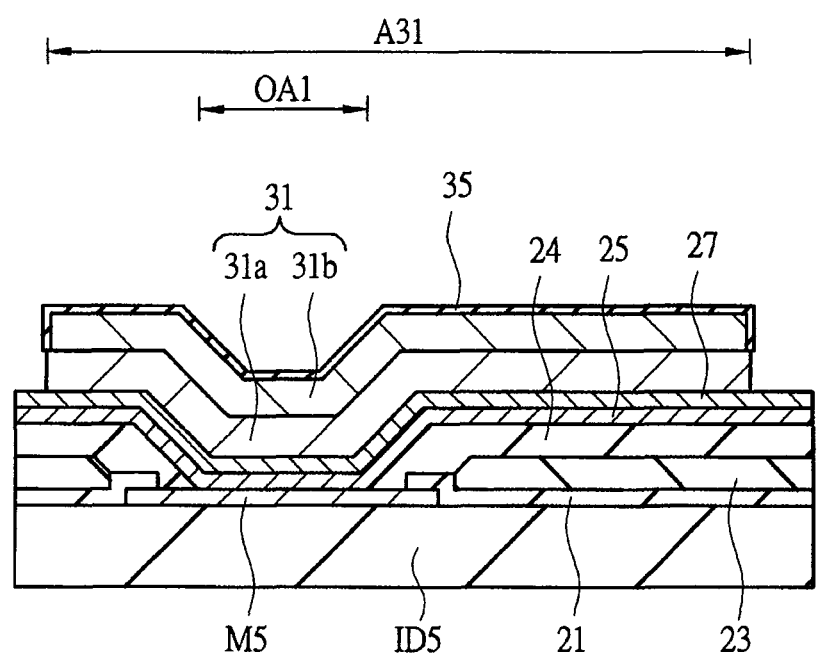
FIG. 20 is a cross-sectional view of essential parts showing the manufacturing step of the semiconductor device in the second embodiment, showing the step following that in FIG. 19.

Next, as shown in FIG. 20, the Ni film 31b configuring the rewiring 31 is subjected to passivation processing. For example, by immersing the semiconductor substrate 1 in a processing liquid (ammonia/hydrogen peroxide mixture) containing ammonia and a hydrogen peroxide solution and bringing the Ni film 31b into contact with the processing liquid, the passivation reaction (oxidation reaction) is caused to occur on the exposed surfaces of the Ni film 31b, and thus the Ni passivation film 35 is formed. Because of this, the Ni passivation film 35 is formed on the upper surface and side surface of the Ni film 31b. At this time, it is possible to appropriately promote the passivation reaction by heating the processing liquid to a temperature equal to or higher than the room temperature (25° C.) or preferably, to 50° C. or higher.

As the processing liquid for passivation processing, it may also be possible to use a mixture containing hydrogen peroxide (processing liquid containing a hydrogen peroxide solution) other than the ammonia/hydrogen peroxide mixture. As another mixture containing hydrogen peroxide, it may also be possible to use a sulfuric acid/hydrogen peroxide mixture (processing liquid containing a sulfuric acid and a hydrogen peroxide solution). However, it is preferable to use an ammonia/hydrogen peroxide mixture because the sulfuric acid/hydrogen peroxide mixture may etch the Cu film (31a).

As the passivation processing, it may also be possible to use the plasma oxidation method. That is, it may also be possible to form the Ni passivation film 35 on the exposed surface of the Ni film 31b by producing plasma in an oxidizing atmosphere (for example, an atmosphere containing oxygen), arranging the semiconductor substrate 1 inside the atmosphere, and causing the oxygen plasma (oxygen radical) to react with the Ni film 31b.

Figure 21:
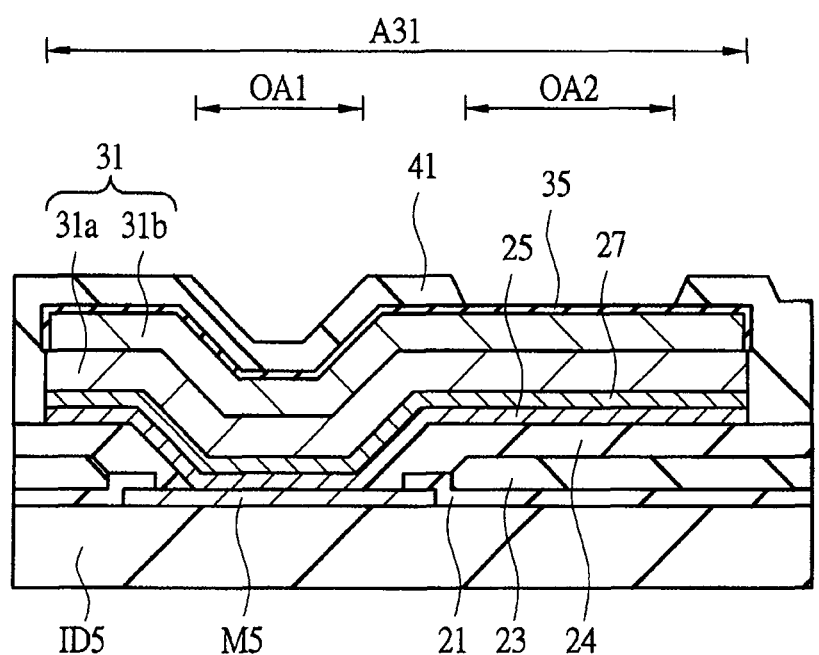
FIG. 21 is a cross-sectional view of essential parts showing the manufacturing step of the semiconductor device in the second embodiment, showing the step following that in FIG. 20.

Next, as shown in FIG. 21, by wet etching, the Cu seed layer (Cu layer) 27 in the region other than the rewiring formation region A31 and the barrier film (Cr film) 25 are removed sequentially.

Etching of the Cu seed layer 27 is performed by using an etchant containing a sulfuric acid/hydrogen peroxide mixture (solution containing a sulfuric acid and a hydrogen peroxide solution) or nitric acid/hydrogen peroxide mixture (solution containing a nitric acid and a hydrogen peroxide solution). Next, after removing the Cu seed layer 27, the barrier film (Cr film) 25 is etched by, for example, using a solution containing potassium permanganate. It should be noted that when the above-mentioned Ti-based film (a single layer film including a TiN film or Ti film or a stacked film of these) is used as a barrier film, it is possible to perform etching by using the ammonia/hydrogen peroxide mixture.

Here, as an etchant of the above-mentioned Cu seed layer 27, a sulfuric acid/hydrogen peroxide mixture or nitric acid/hydrogen peroxide mixture is used, and thus not only Cu but also Ni is dissolved. In this manner, most of the etchant of Cu dissolve Ni also. However, in the present embodiment, the Ni passivation film 35 is formed on the surface of the Ni film 31b, and thus it is possible to prevent etching (reduction in film thickness) of the Ni film 31b.

As a result, the following effects are achieved.

(1) By preventing etching of the Ni film 31b, it is possible to form the Ni film 31b thin from the beginning, and thereby, to suppress costs.

(2) If the Ni film 31b is formed thick in view of the reduction in film thickness of the Ni film 31b, the stress of the film (film stress) becomes larger and distortion occurs in the semiconductor substrate 1. As a result, in the processing step such as the exposure step, the transportation step between processing devices, etc., during the period from the film formation step of the Ni film 31b to the etching step of the above-mentioned Cu seed layer 27, an error in fixation and transportation of the semiconductor substrate 1 occurs. As a result, throughput of the manufacturing step is reduced. Furthermore, when the distortion is large, a defect occurs and manufacturing yields are reduced. Moreover, this may lead to deterioration of the characteristics of the semiconductor elements (for example, Qn, Qp, etc.) in the lower layer, breakage of the wirings (for example, M1 to M5), etc. In contrast to this, in the present embodiment, as described above, it is possible to form the Ni film 31b thin in advance, and thus it is possible to avoid the above-mentioned trouble.

When the amount of reduction in film thickness is set to be somewhat larger in view of the variation in etching, the film thickness of the Ni film remaining after the etching step of the Cu seed layer 27 also becomes greater than a desired film thickness. As a result, in the subsequent steps, the state where film stress is large lasts. Because of this, in the subsequent steps such as a probe test step and laser relief step (fuse programming step), to be described later, an error in fixation (for example, fixation by adsorption) and transportation of the semiconductor substrate 1 may occur. Also in such a case, the throughput of the manufacturing step is reduced.

In contrast to this, in the present embodiment, it is possible to optimize the thickness of the Ni film 31b, to improve the throughput of the manufacturing step, and furthermore to improve the characteristics of a semiconductor device by reducing the film stress of the Ni film 31b.

(3) Moreover, the Ni passivation film 35 is formed also on the side surface of the Ni film 31b configuring the rewiring 31, and thus it is possible to reduce side etching of the Ni film 31b. That is, when the Ni passivation film 35 is not formed, the side surface of the Ni film 31b of the rewiring 31 is exposed to the sulfuric acid/hydrogen peroxide mixture or nitric acid/hydrogen peroxide mixture, and thus etching (erosion) of the Ni film progresses from the above-mentioned side surface. If such side etching of the Ni film 31b progresses, the side etching of the Cu film 31a in the lower layer may also progress. The pattern area of the rewiring 31 is larger as compared with the pad pattern (33) in the first embodiment, and thus the problem of the side etching of the Ni film 31b and the Cu film 31a is small, but it is preferable that the amount of the above-mentioned side etching is small in order to cope with the reduction in resistance of a wiring, miniaturization of the wiring width, etc. As described above, in the present embodiment, it is possible to reduce the side etching of the Ni film 31b and reduce the side etching of the Cu film 31a (it should be noted that the effect is the same also as in the first embodiment).

Next, after removing the Cu seed layer (Cu film) 27 and the barrier film (Cr film) 25 in the region other than the rewiring formation region A31, for example, a photosensitive polyimide film is applied as the surface protection insulating film 41, over the third protection insulating film 24 including the top of the Ni passivation film 35, as shown in FIG. 21. Next, by exposing/developing the photosensitive polyimide film to selectively remove the photosensitive polyimide film, the opening OA2 is formed. The opening OA2 is located at the upper part of the rewiring 31 and corresponds to the pad region Pd.

Figure 22:
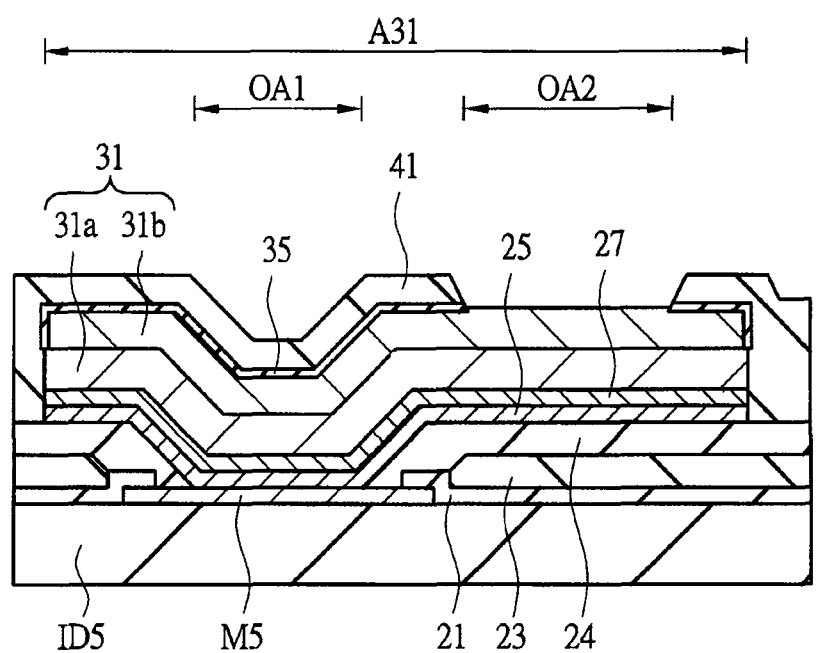
FIG. 22 is a cross-sectional view of essential parts showing the manufacturing step of the semiconductor device in the second embodiment, showing the step following that in FIG. 21.

Next, as shown in FIG. 22, the Ni passivation film 35 exposed from the opening OA2 of the surface protection insulating film 41 is removed. The Ni passivation film 35 can be removed by plasma processing in a reducing atmosphere. For example, in an atmosphere containing hydrogen ($H_2$), by generating plasma and causing hydrogen plasma (hydrogen radical) to react with the Ni passivation film 35 (oxide film of Ni), the Ni passivation film 35 is reduced. Because of this, the Ni passivation film 35 is removed and the Ni film 31b is exposed from the opening OA2 of the surface protection insulating film 41. It may also be possible to perform ammonia plasma processing in place of the plasma processing (hydrogen plasma processing) in the above-mentioned hydrogen atmosphere. In this case, in the atmosphere containing ammonia ($NH_3$), plasma is generated and the hydrogen radical or hydrogen nitride radical is caused to react with the Ni passivation film 35 (oxide film of Ni).

Figure 23:
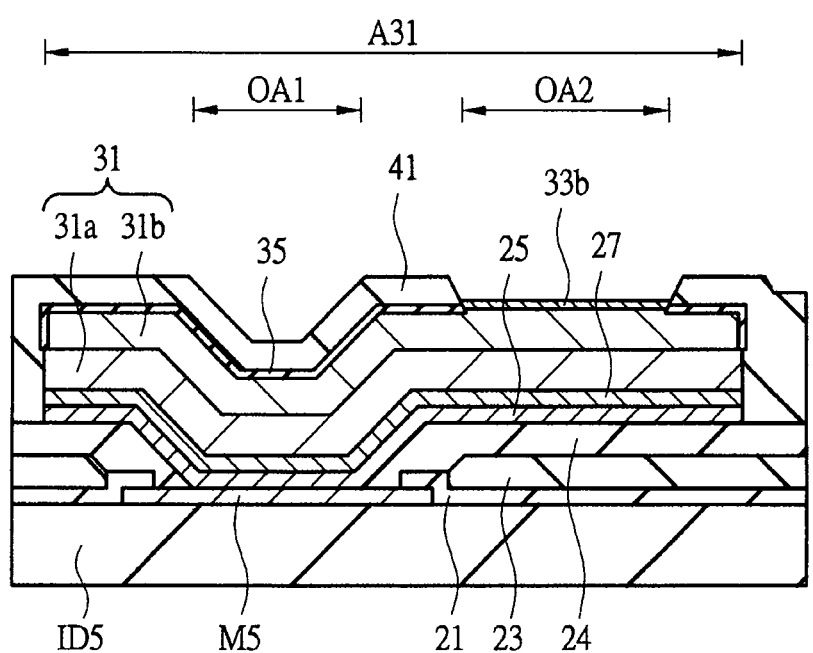
FIG. 23 is a cross-sectional view of essential parts showing the manufacturing step of the semiconductor device in the second embodiment, showing the step following that in FIG. 22.

Next, as shown in FIG. 23, over the Ni film 31b inside the opening OA2 of the surface protection insulating film 41, the Au film 33b is formed by electroless plating method (substitution plating method). The film thickness of the Au film 33b is about 10 to 200 nm. The surface of the Au film 33b forms the pad region (bump electrode formation region) Pd.

After that, in the pad region Pd, the bump electrode BP is formed. For example, by temporarily fixing a solder ball over the Au film 33b (pad region Pd) with flux etc. and melting and resolidifying the solder by performing solder reflow processing (reflow processing, thermal processing), the bump electrode BP including solder is formed over the pad region Pd. It may also be possible to form the bump electrode BP including solder by supplying solder paste through the printing method etc., in place of the solder ball, and solidifying it. In addition, when forming the bump electrode BP including solder, the above-mentioned Au film 33b, which is comparatively thin, melts into the solder and there is a case where it is not possible to recognize the Au film 33b as the final structure (see FIG. 1).

[Mounting Step]

Next, as necessary, after performing the probe test and the fuse programming steps, by cutting (dicing) the semiconductor substrate (wafer) 1, it is separated (singulated) into a plurality of semiconductor chips. It should be noted that it may also be possible to grind the back surface of the semiconductor substrate (wafer) 1 to thin the semiconductor substrate 1 before dicing. Next, the semiconductor chip is mounted over the wiring substrate. On the side of the wiring substrate, on which the chip is mounted, the external coupling terminal (external terminal, terminal) is formed. Consequently, at the time of mounting, the bump electrode BP of the semiconductor chip and the external coupling terminal of the wiring substrate are aligned and then mounted (face-down bonding). Next, after heating and ref lowing the bump electrode BP, the semiconductor chip and the wiring substrate are fixed by a resin etc.

Figure 24:
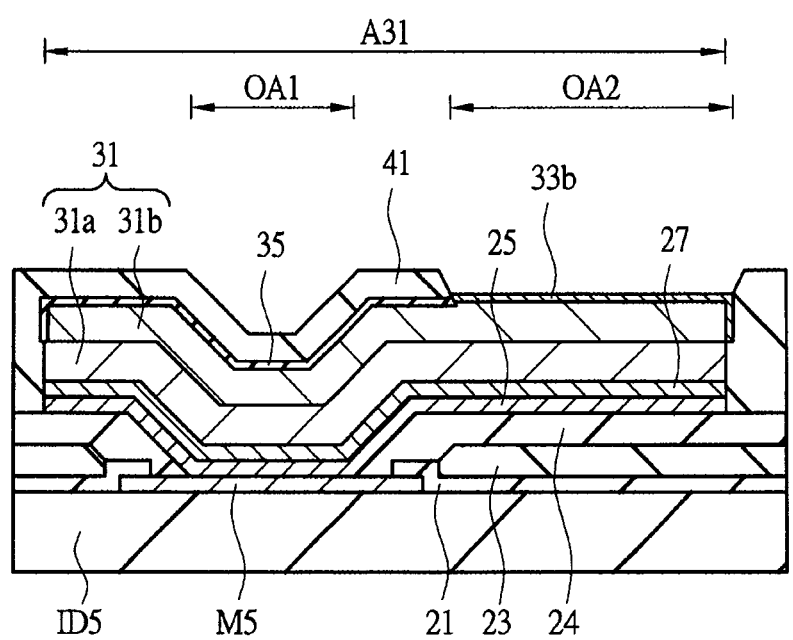
FIG. 24 is a cross-sectional view of essential parts showing another configuration of the semiconductor device in the second embodiment.

It should be noted that in the present embodiment, the opening OA2 is arranged within the rewiring formation region A31 and the Au film 33b is formed inside the opening OA2, but it may also be possible to make the opening OA2 larger than the end part region of the rewiring 31. FIG. 24 is a cross-sectional view of essential parts showing another configuration of the semiconductor device in the present embodiment.

For example, as shown in FIG. 8 in the first embodiment, it may also be possible to regard the region including the outer circumference of the end part region of the rewiring 31 as the opening OA2 and form the Au film 33b inside the opening OA2. As a result, as shown in FIG. 24, the Au film 33b is arranged so as to cover not only the upper surface of the end part region of the rewiring 31 but also its side surface, and thus, the contact area between the rewiring 31 and the Au film 33b increases, and thus, it is possible to reduce the peeling of the Au film 33b.

Third Embodiment

In the second embodiment, the bump electrode BP is formed over the end part of the rewiring 31 including the stacked film of the Cu film 31a and the Ni film 31b, but it may also be possible to form the bump electrode BP directly over the opening OA1 of the fifth layer wiring M5, which is the uppermost wiring. At this time, it may also be possible to arrange a stacked film of a Cu film 30a and a Ni film 30b as the pad pattern 30 in the lower layer of the bump electrode BP.

Hereinafter, with reference to the drawings, the configuration of the semiconductor device and the manufacturing method in the present embodiment are explained in detail. FIG. 25 to FIG. 30 are cross-sectional diagrams of essential parts showing the manufacturing steps of the semiconductor device in the present embodiment.

[Explanation of Structure]

First, with reference to FIG. 30, which is the final step diagram of the cross-sectional view of essential parts showing the manufacturing step of the semiconductor device in the present embodiment, the characteristic configuration of the semiconductor device in the present embodiment will be explained. The present embodiment differs from the second embodiment in that the pad pattern 30 is arranged in place of the rewiring 31 in the second embodiment, but other configurations are the same as those in the second embodiment, and thus the configuration of the pad pattern 30 will be explained in detail.

The semiconductor device in the present embodiment also has, as in the second embodiment, for example, the p-channel type MISFET Qp and the n-channel type MISFET Qn as the semiconductor elements formed over the semiconductor substrate (substrate) 1 (see FIG. 13). Besides the MISFETs, it may also be possible to have other various elements such as capacitor elements, resistor elements, and memory cells.

Over the MISFETs, the interlayer insulating film ID1 is arranged. Furthermore, over the source/drain regions (3n, 3p) of the MISFET, the first layer wiring M1 is arranged via the plug P1.

Moreover, in the semiconductor device in the present embodiment also, as in the second embodiment, over the first layer wiring M1, the wiring layers (the second layer wiring M2 to the fourth layer wiring M4) are formed. Each wiring layer is electrically coupled by the plug P2 to the plug P4 and other regions are electrically insulated by the interlayer insulating films ID2 to IF4.

The first layer wiring M1 to the fourth layer wiring M4 are Cu wirings including a conductive film including Cu as a principal component, that is, so-called damascene wirings. The fifth layer wiring M5, which is the uppermost layer, is an Al wiring including a conductive film including Al as a principal component. In addition, it may also be possible to form the first layer wiring M1 to the fourth layer wiring M4 into the Al wiring.

Over the fifth layer wiring (uppermost layer wiring) M5, the protection insulating films (21, 23, and 24, insulating film) are formed and from the opening (here, the opening of the third protection insulating film 24) OA1 of the protection insulating film, the fifth layer wiring (Al film) M5 is exposed.

The pad pattern 30 one size larger than the exposed part (the opening OA1, the first pad region) is arranged so that its outer circumference covers over the protection insulating films (21, 23, and 24). The pad pattern 30 includes the stacked film of the copper film (conductive film including Cu as a principal component) 30a and the nickel film (conductive film including Ni as a principal component) 30b. The Cu film 30a is a film grown by plaiting by a thin copper film, which is the seed layer in the lower layer, and in the lower layer of the Cu film 31a, the seed layer 27 is arranged. At the lower part of the Cu seed layer 27, the barrier film 25 is arranged. The Ni film 30b is a film grown by plating over the Cu film 30a. In addition, the seed layer 27 and the barrier layer 25 also have conductivity, and thus they can be considered to be included in the pad pattern 30.

Over the pad pattern 30 (Ni film 30b), the surface protection insulating film (41, insulating film) is formed and from the opening OA2 of the surface protection insulating film 41, the pad pattern 30 is exposed. Within the opening OA2, the Au film 33b is arranged. The opening OA2 forms the pad region Pd. Over the pad region Pd, the bump electrode BP is arranged and electrical coupling of the semiconductor device with the external coupling terminal, such as the wiring substrate, to be described later, is aimed at via the bump electrode BP.

As the characteristic configuration of the semiconductor device in the present embodiment, on the surface of the Ni film 30b configuring the pad pattern 30, in the region other than the opening OA2, the Ni passivation film 35 is arranged. In other words, in the region sandwiched by the Ni film 30b and the surface protection insulating film (41, insulating film), the Ni passivation film 35 is arranged.

By arranging the Ni passivation film 35 as described above, the corrosion resistance of the Ni film 30b is improved. Furthermore, as will be explained in detail in a manufacturing step, to be described later, it is possible to reduce the reduction in film thickness of the Ni film 30b when etching the Cu seed layer 27.

[Explanation of Manufacturing Method]

Next, with reference to FIG. 25 to FIG. 30, the manufacturing step of the semiconductor device in the present embodiment will be explained and at the same time, the configuration of the semiconductor device is made clearer.

First, as in the second embodiment, the semiconductor substrate 1 on which the wirings (M1 to M5) are formed above the semiconductor elements (the n-channel type MISFET Qn and the p-channel type MISFET Qp) is prepared. The step of forming the semiconductor elements (the n-channel type MISFET Qn and the p-channel type MISFET Qp) and the step of forming the first layer wiring M1 to the fifth layer wiring M5 are the same as those in the second embodiment, and thus their explanation is omitted.

[Step or the Like of Forming Protection Insulating Film, Rewiring, and Pad Pattern]

Figure 25:
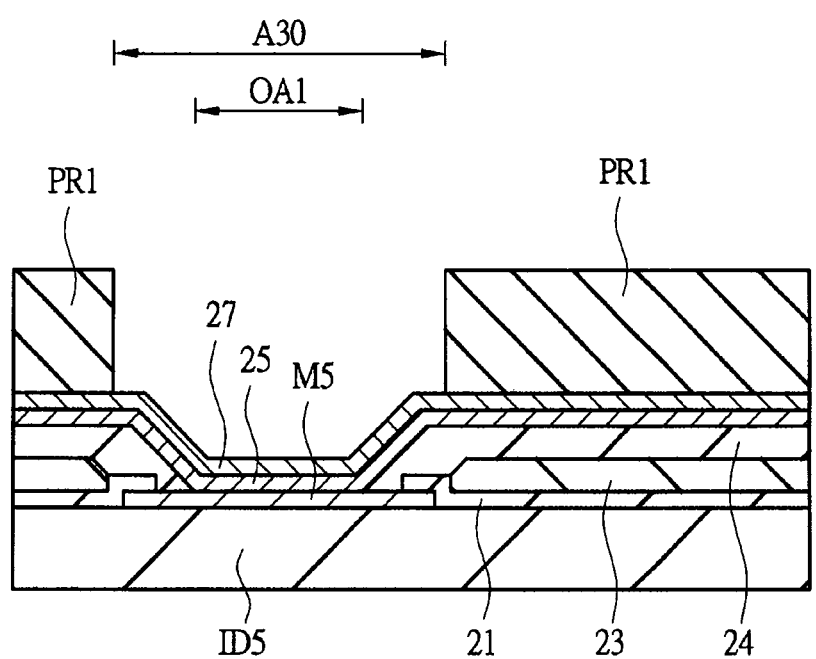
FIG. 25 is a cross-sectional view of essential parts showing a manufacturing step of a semiconductor device in a third embodiment.

As shown in FIG. 25, after forming the fifth layer wiring M5, the first protection insulating film 21, the second protection insulating film 23, and the third protection insulating film 24 are formed. The stacked film of the protection insulating films (21, 23, and 24) has the opening OA1 and from the opening OA1, the fifth layer wiring (Al film) M5 is exposed. It is possible to form the protection insulating films (21, 23, and 24) and the opening OA1 in the same steps as those in the second embodiment.

Next, over the third protection insulating film 24 including the top of the opening OA1, for example, the barrier film 25 including a Cr film or a stacked film of Ti/TiN/Ti (Ti-based film) is deposited by the sputtering method etc. and furthermore, over the barrier film 25, a thin film of copper (copper film) is formed as the Cu seed layer 27 for electrolytic plating by the sputtering method etc.

Then, by applying the photoresist film PR1 over the Cu seed layer 27 and exposing/developing the photoresist film PR1, the photoresist film PR1 in a pad pattern formation region A30 is removed. The pad pattern formation region A30 is a region including the opening OA1.

Figure 26:
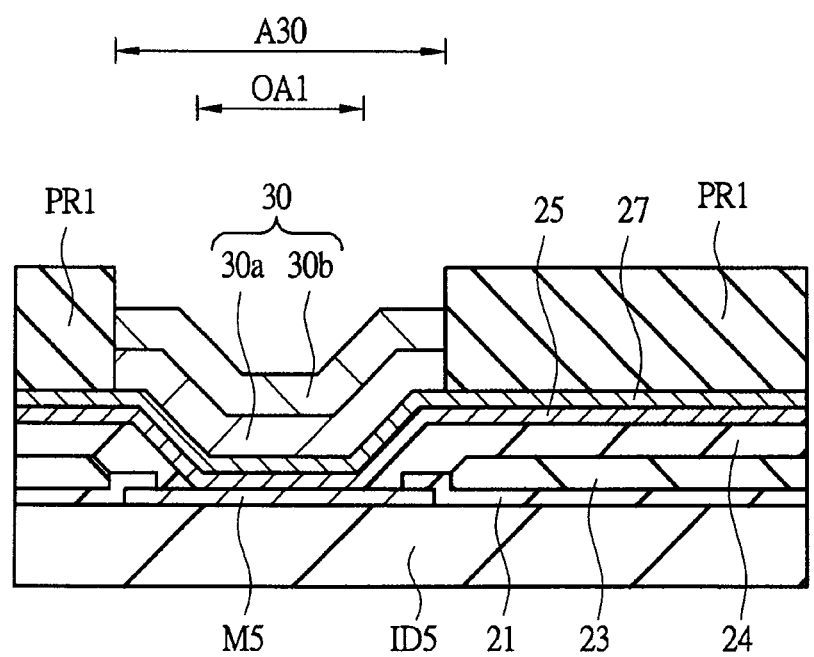
FIG. 26 is a cross-sectional view of essential parts showing the manufacturing step of the semiconductor device in the third embodiment, showing the step following that in FIG. 25.

Next, as shown in FIG. 26, inside the remaining photoresist film (mask film) PR1, that is, over the Cu seed layer 27 of the pad pattern formation region A30, the Cu film (copper film) 30a is formed by the electrolytic plating method. Then, inside the photoresist film PR1, that is, over the Cu film 30a of the pad pattern formation region A30, the Ni film (nickel film) 30b is formed by the electrolytic plating method. The film thickness of the Cu film 30a is, for example, about 4 to 7 µm. In addition, the film thickness of the Ni film 30b is about 2 to 4 µm.

Cu has a low resistance and the use of the Cu film 30a in the pad pattern 30 is appropriate. Furthermore, by forming the Ni film 30b over the Cu film 30a, it is possible to protect the Cu film 30a and improve corrosion resistance of the Cu film 30a.

Figure 27:
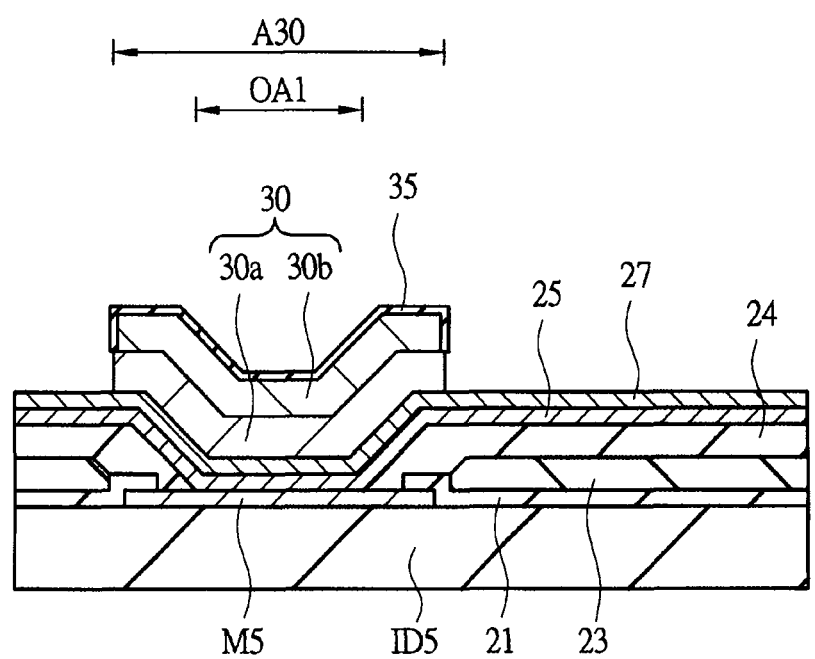
FIG. 27 is a cross-sectional view of essential parts showing the manufacturing step of the semiconductor device in the third embodiment, showing the step following that in FIG. 26.

Then, as shown in FIG. 27, the photoresist film PR1 is removed. As a result, in the pad pattern formation region A30, the surface of the Ni film 30b and the side surfaces of the Cu film 30a and the Ni film 30b are exposed and in the region other than the pad pattern formation region A30, the Cu seed layer 27 is exposed.

Next, the same processing as that in the second embodiment is performed on the Ni film 30b configuring the pad pattern 30 and the Ni passivation film 35 is formed.

Figure 28:
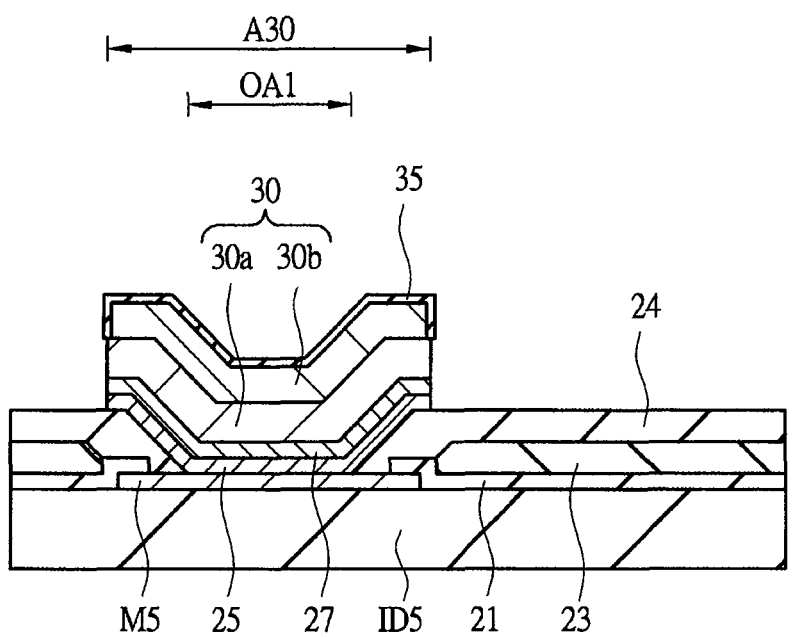
FIG. 28 is a cross-sectional view of essential parts showing the manufacturing step of the semiconductor device in the third embodiment, showing the step following that in FIG. 27.

Then, as shown in FIG. 28, by the same wet etching as that in the second embodiment, the Cu seed layer 27 and the barrier film (Cr film) 25 in the region other than the pad pattern formation region A30 are removed sequentially.

Here, as an etchant of the Cu seed layer 27 including a thin film of Cu, as explained in detail in the second embodiment, a sulfuric acid/hydrogen peroxide mixture or nitric acid/hydrogen peroxide mixture is used, and thus, not only Cu but also Ni is dissolved. However, in the present embodiment, on the surface and side surface of the Ni film 30b, the Ni passivation film 35 is formed, and thus it is possible to prevent etching (reduction in film thickness) of the Ni film 30b.

As a result, the following effects are achieved.

(1) By preventing etching of the Ni film 30b, it is possible to form the Ni film 30b thin from the beginning and to thereby suppress the cost.

(2) When the Ni film 30b is formed thick in view of the reduction in film thickness of the Ni film 30b, as explained in the second embodiment, the stress of the film increases, but it is possible to reduce the film stress, to reduce the transportation error etc., and to improve the characteristics of the semiconductor device.

(3) Furthermore, the Ni passivation film 35 is formed also on the side surface of the pad pattern 30, and thus it is possible to reduce side etching of the Ni film 30b. That is, when the Ni passivation film 35 is not formed, the side surface of the Ni film 30b of the pad pattern 30 is exposed to the sulfuric acid/hydrogen peroxide mixture or nitric acid/hydrogen peroxide mixture, and thus etching (erosion) of the Ni film 30b proceeds from the side surface. The eroded part serves as the start point and the pad pattern 30 becomes easy to be peeled off. In particular, the pad pattern 30 is easy to be peeled off because the pattern area is small. In contrast to this, in the present embodiment, it is possible to reduce side etching of the Ni film 30b and reduce peeling of the pad pattern 30.

Figure 29:
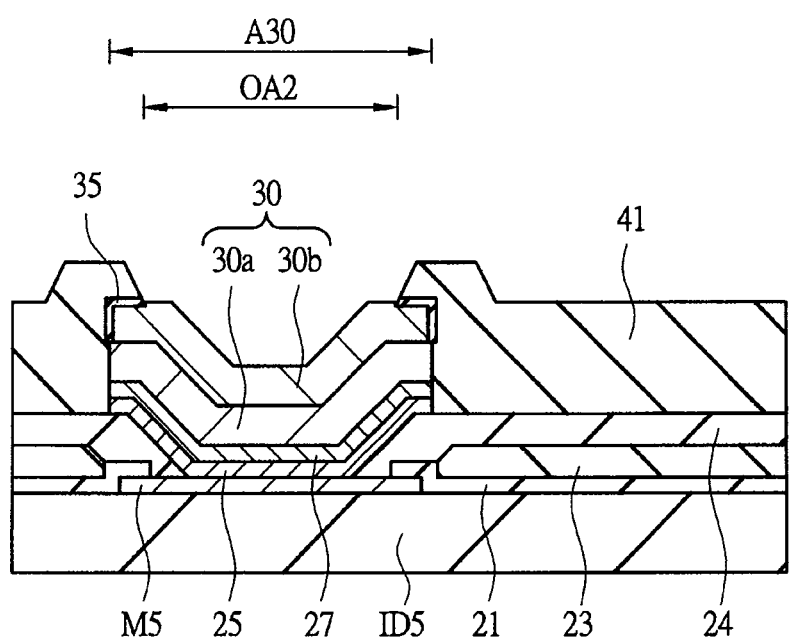
FIG. 29 is a cross-sectional view of essential parts showing the manufacturing step of the semiconductor device in the third embodiment, showing the step following that in FIG. 28.

Next, after removing the Cu seed layer 27 and the barrier film (Cr film) 25 in the region other than the pad pattern formation region A30, over the third protection insulating film 24 including the top of the Ni passivation film 35, as the surface protection insulating film 41, for example, a photosensitive polyimide film is applied as shown in FIG. 29. Then, by exposing/developing the photosensitive polyimide film to selectively remove the photosensitive polyimide film, the opening OA2 is formed. The opening OA2 is located at the upper part of the pad pattern 30 and corresponds to the pad region (Pd).

Next, the Ni passivation film 35 exposed from the opening OA2 is removed. The passivation film 35 can be removed by plasma processing in the reducing atmosphere explained in the second embodiment.

Then, as shown in FIG. 30, over the Ni film 30b inside the opening OA2, the Au film 33b is formed by the electroless plating method (substitution plating method). The film thickness of the Au film 33b is about 10 to 20 nm. The surface of the Au film 33b forms the pad region (bump electrode formation region) Pd.

After that, although not shown schematically, in the pad region Pd, the bump electrode BP is formed as in the second embodiment. For example, by temporarily fixing a solder ball over the Au film 33b (pad region Pd) with flux etc. and melting and resolidifying the solder through the use of solder reflow processing (reflow processing, thermal processing), the bump electrode BP including solder is formed over the pad region Pd (see FIG. 13).

[Mounting Step]

Next, as necessary, after performing the probe test and the fuse programming steps, as in the second embodiment, the cut-out semiconductor substrate (wafer) 1 is bonded face-down over the wiring substrate.

The present invention made by the inventors of the present invention has been explained specifically based on the first to third embodiments as above, but the present invention is not limited to the first to third embodiments and it is needless to say that there can also be various modifications within a range not departing from the gist of the invention.

For example, in the first embodiment, the two wiring layers (M1, M2) are formed and in the second and third embodiments, the five wiring layers (M1 to M5) are formed, but the number of wiring layers is not limited and it is also possible to appropriately change the conductive material configuring the wiring.

The present invention relates to a manufacturing method of a semiconductor device and a semiconductor device and, in particular, is appropriate when applied to a manufacturing method of a semiconductor device having a Cu—Ni wiring and to the configuration of a semiconductor device having a Cu—Ni wiring.

What is claimed is:

1. A manufacturing method of a semiconductor device, comprising the steps of:
   (a) forming a first wiring including a conductive film above a substrate;
   (b) forming a first insulating film that exposes a first region of the first wiring over the first wiring;
   (c) forming a second wiring extending from the first region of the first wiring over the first insulating film, and by the steps of:
       (c1) forming a first copper film including copper as a principal component over the first region and the first insulating film;
       (c2) forming a first mask film that opens a formation region of the second wiring over the first copper film;
       (c3) forming a second copper film including copper as a principal component by plating-growth over the first copper film in the formation region of the second wiring; and
       (c4) forming a first nickel film including nickel as a principal component over the second copper film, forming the second wiring including the first copper film, the second copper film, and the first nickel film;

(d) forming a gold film including gold as a principal component in a pad region over the second wiring;
(e) after the step (d), forming a passivation film of nickel oxide on the surface of the first nickel film by removing the first mask film and performing passivation processing on the first nickel film; and
(f) after the step (e), etching the first copper film.

2. The manufacturing method of a semiconductor device according to claim 1, further comprising, between the step (c) and the step (d), a step (g) including the steps of:
(g1) forming a second mask film that opens the pad region located over the second wiring over the first nickel film and the first mask film; and
(g2) forming a second nickel film including nickel as a principal component by plating-growth in the pad region,
wherein the step (d) is a step of forming the gold film over the second nickel film, and
wherein the step (e) is a step of, after the step (d), forming a passivation film of nickel oxide on the surface of the first nickel film and the side surface of the second nickel film by removing the first mask film and the second mask film and performing passivation processing on the first nickel film and the second nickel film.

3. The manufacturing method of a semiconductor device according to claim 2,
wherein the pad region is a region including an end part of the second wiring and an outer circumference thereof.

4. The manufacturing method of a semiconductor device according to claim 1,
wherein the passivation processing in the step (e) is performed by bringing the first nickel film into contact with a processing liquid containing a hydrogen peroxide solution.

5. The manufacturing method of a semiconductor device according to claim 4,
wherein the processing liquid contains ammonia and the hydrogen peroxide solution.

6. The manufacturing method of a semiconductor device according to claim 5,
wherein the processing liquid is used by being heated to 25° C. or more.

7. The manufacturing method of a semiconductor device according to claim 1,
wherein the passivation processing in the step (e) is performed by subjecting the first nickel film to plasma processing in an oxidizing atmosphere.

8. The manufacturing method of a semiconductor device according to claim 1,
wherein the etching in the step (f) is performed by using a liquid containing a sulfuric acid and a hydrogen peroxide solution or a liquid containing a nitric acid and a hydrogen peroxide solution.

9. The manufacturing method of a semiconductor device according to claim 1,
wherein the step (c1) is a step of forming the first copper film over a barrier film after forming the barrier film over the first region and the first insulating film.

10. The manufacturing method of a semiconductor device according to claim 9,
wherein the barrier film has a chromium film including chromium as a principal component or a titanium film including titanium as a principal component.

11. The manufacturing method of a semiconductor device according to claim 1,
wherein the first wiring has an aluminum film including aluminum as a principal component.

12. The manufacturing method of a semiconductor device according to claim 1, further comprising
a step (h) of coupling the gold film in the pad region and an external terminal of a mounting substrate via a conductive wire.

13. A manufacturing method of a semiconductor device, comprising the steps of:
(a) forming a first conductive film above a substrate;
(b) forming a first insulating film that exposes a first region of the first conductive film over the first conductive film;
(c) forming a second conductive film located over the first region of the first conductive film and the first insulating film and by the steps of:
(c1) forming a first copper film including copper as a principal component over the first region and the first insulating film;
(c2) forming a first mask film that opens a formation region of the second conductive film over the first copper film;
(c3) forming a second copper film including copper as a principal component by plating-growth over the first copper film in the formation region of the second conductive film; and
(c4) forming a nickel film including nickel as a principal component over the second copper film, forming the second conductive film including the first copper film, the second copper film, and the nickel film;
(d) after the step (c), forming a passivation film of nickel oxide on the surface of the nickel film by removing the first mask and performing passivation processing on the nickel film;
(e) after the step (d), etching the first copper film;
(f) removing the passivation film over a pad region of the second conductive film; and
(g) after the step (f), forming a gold film including gold as a principal component in the pad region.

14. The manufacturing method of a semiconductor device according to claim 13,
wherein the step (f) is a step of removing the passivation film over the pad region by plasma processing in a reducing atmosphere.

15. The manufacturing method of a semiconductor device according to claim 14,
wherein the plasma processing in the reducing atmosphere is hydrogen plasma processing.

16. The manufacturing method of a semiconductor device according to claim 14,
wherein the plasma processing in the reducing atmosphere is ammonia plasma processing.

17. The manufacturing method of a semiconductor device according to claim 13, further comprising between the step (e) and the step (f):
a step (h) of forming a second insulating film that opens the pad region over the second conductive film,
wherein the step (f) is a step of removing the passivation film over the pad region by using the second insulating film as a mask.

18. The manufacturing method of a semiconductor device according to claim 13, further comprising, after the step (g):
a step (i) of forming a bump electrode over the gold film in the pad region.

19. The manufacturing method of a semiconductor device according to claim 18,
wherein the second conductive film is a wiring that electrically couples the first region of the first conductive film and the bump electrode.

20. The manufacturing method of a semiconductor device according to claim 18,
   wherein the second conductive film is a base layer of the bump electrode.

21. The manufacturing method of a semiconductor device according to claim 13,
   wherein the passivation processing in the step (d) is performed by bringing the first nickel film into contact with a processing liquid containing a hydrogen peroxide solution.

22. The manufacturing method of a semiconductor device according to claim 21,
   wherein the processing liquid is a processing liquid containing ammonia and the hydrogen peroxide solution.

23. The manufacturing method of a semiconductor device according to claim 22,
   wherein the processing liquid is used by being heated to 25° C. or more.

24. The manufacturing method of a semiconductor device according to claim 13,
   wherein the passivation processing in the step (d) is performed by plasma processing of the nickel film in an oxidizing atmosphere.

25. The manufacturing method of a semiconductor device according to claim 13,
   wherein the etching in the step (e) is performed by using a liquid containing a sulfuric acid and a hydrogen peroxide solution or a liquid containing a nitric acid and a hydrogen peroxide solution.

* * * * *